US008692518B2

(12) United States Patent  
Uchida et al.

(10) Patent No.: US 8,692,518 B2  
(45) Date of Patent: Apr. 8, 2014

(54) ELECTRONIC APPARATUS

(75) Inventors: Takayuki Uchida, Tokorozawa (JP); Kohichi Satoh, Niiza (JP); Masaaki Namekawa, Kiyose (JP)

(73) Assignee: Citizen Holdings Co., Ltd., Tokyo (JP)

( * ) Notice: Subject to any disclaimer, the term of this patent is extended or adjusted under 35 U.S.C. 154(b) by 512 days.

(21) Appl. No.: 12/375,192

(22) PCT Filed: Jul. 24, 2007

(86) PCT No.: PCT/JP2007/064838
§ 371 (c)(1),
(2), (4) Date: Jan. 26, 2009

(87) PCT Pub. No.: WO2008/013299
PCT Pub. Date: Jan. 31, 2008

(65) Prior Publication Data
US 2010/0072974 A1   Mar. 25, 2010

(30) Foreign Application Priority Data

Jul. 27, 2006   (JP) ................................. 2006-204792

(51) Int. Cl.
*H02J 7/00* (2006.01)
(52) U.S. Cl.
USPC ........................... 320/133; 320/132; 320/136
(58) Field of Classification Search
USPC .......................................... 324/133; 320/133
See application file for complete search history.

(56) References Cited

U.S. PATENT DOCUMENTS 4,240,021 A * 12/1980 Kashima et al. ............. 320/101
5,268,630 A * 12/1993 Bhagwat et al. ............. 320/151
5,420,493 A *  5/1995 Hargadon et al. ............ 320/106
5,589,755 A * 12/1996 Kaite et al. .................. 320/160
6,049,884 A *  4/2000 Tsuji ............................ 713/323
6,157,171 A * 12/2000 Smith .......................... 320/133
6,191,559 B1 *  2/2001 Berthoud et al. ............ 320/136
6,222,709 B1 *  4/2001 Baba ............................. 361/18
6,424,157 B1 *  7/2002 Gollomp et al. ............. 324/430
6,801,146 B2 * 10/2004 Kernahan et al. ............ 341/122
6,930,466 B2 *  8/2005 Bradley et al. .............. 320/133
7,289,166 B2 * 10/2007 Kimura ........................ 348/730

(Continued)

FOREIGN PATENT DOCUMENTS

JP      2006-127792     5/2006
WO   WO 2005/083873    9/2005

OTHER PUBLICATIONS

Supplementary Search Report dated Apr. 10, 2010 issued in corresponding European patentapplication.

*Primary Examiner* — Benjamin M Baldridge
(74) *Attorney, Agent, or Firm* — Finnegan, Henderson, Farabow, Garrett & Dunner, L.L.P.

(57) ABSTRACT

The invention provides a compact and highly reliable electronic apparatus that can be driven by a small-capacity battery, and that can achieve high-speed continuous driving of a load by quickly judging the recovery state of the battery after driving the load. More particularly, the invention provides an electronic apparatus includes a power supply, a load, a load driver for driving the load by the power supply, a power supply state detector for outputting power supply recovery information by measuring physical quantity of the power supply at predetermined intervals of time after the driving of the load is stopped, and a controller for instructing the load driver to drive the load, based on the power supply recovery information supplied from the power supply state detector.

14 Claims, 15 Drawing Sheets

(56) References Cited

U.S. PATENT DOCUMENTS

| | | | |
|---|---|---|---|
| 7,394,224 B2* | 7/2008 | Wanibuchi et al. | 320/149 |
| 7,425,815 B2* | 9/2008 | Wong et al. | 320/141 |
| 7,663,978 B2* | 2/2010 | Kawaguchi et al. | 368/66 |
| 7,911,182 B2* | 3/2011 | Cargonja et al. | 320/133 |
| 7,915,862 B2* | 3/2011 | Kim et al. | 320/133 |
| 2005/0231184 A1* | 10/2005 | Kawaguchi et al. | 323/312 |

* cited by examiner

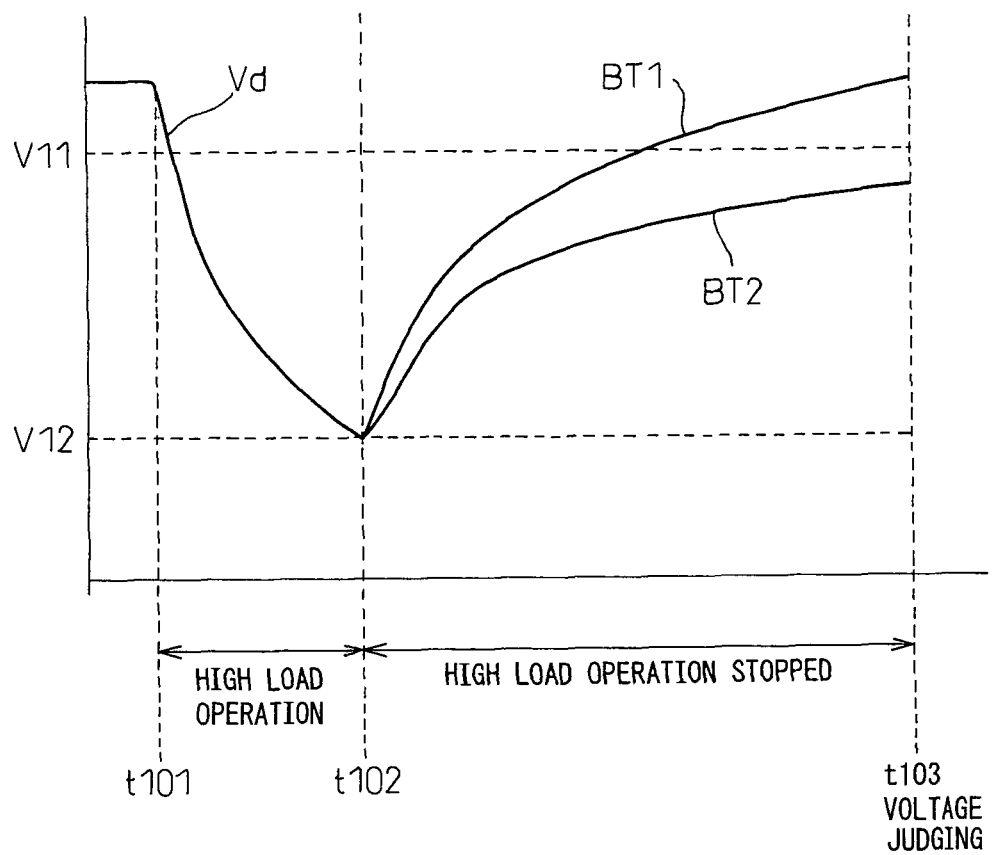

ELECTRONIC APPARATUS

FIELD OF THE INVENTION

The present invention relates to an electronic apparatus powered by a battery, and more particularly to an electronic apparatus that achieves high-speed driving of a load by quickly detecting the recovery of the battery after driving the load.

BACKGROUND OF THE INVENTION

A variety of battery-powered portable electronic apparatuses, including electronic wristwatches and mobile phones, have been introduced into the market. These electronic apparatuses are equipped with high power consuming loads, such as a motor, a buzzer, an illumination device, etc., in order to implement the required functions. Batteries are used as power supplies to drive these high power consuming loads. Most of the batteries used as power supplies in such portable electronic apparatuses are secondary batteries. In recent years, high-performance batteries that are small in size, but large in capacity, such as lithium-ion batteries, have been developed.

However, the performance and functionality of such portable electronic apparatuses has been increasing rapidly, and the number of loads mounted therein has also been increasing. On the other hand, portability and aesthetics are important considerations in the design of portable electronic apparatuses. For example, electronic wristwatches are becoming increasing thin and light-weight. As a result, batteries that can be mounted in them have to be made smaller and thinner, resulting in a situation where the battery capacity decreases and the battery output impedance degrades when the number of loads to be driven is increasing. In this way, the power supply design for portable electronic apparatuses is becoming increasingly constrained, and there is therefore a need for a power supply system that controls the battery as a power supply and the driving of a load in a more efficient manner.

In view of the above situation, it is known to provide a battery-powered electronic apparatus equipped with a voltage judging means that judges the recovery state of a battery after driving a load (refer, for example, to Patent Document 1).

The prior art voltage judging method disclosed in Patent Document 1 will be described below. FIG. 14 is a block diagram showing the configuration of a paging receiver equipped with a voltage judging means as disclosed in Patent Document 1, and FIG. 15 is a characteristic diagram of a battery mounted in the paging receiver.

The paging receiver 50 is an electronic apparatus equipped with the prior art voltage judging means, and has a function to receive a paging signal addressed to it and to display the received information. A reception processing unit 51 detects and demodulates a radio signal received via an antenna ANT. An ID-ROM 52 is a nonvolatile memory for storing address data, etc. of the paging receiver 50. A signal processing unit 53 drives the reception processing unit 51 intermittently.

A control unit 54 is constructed from a CPU, etc., and carries out processing, such as incoming call processing and voltage judgment processing, by controlling the various units in the paging receiver 50 in accordance with a control program stored in a ROM 55. A RAM 56 is used as a working area by the control unit 54, and stores various register and flag data. A voltage measuring circuit 57 measures the voltage of the battery 63, and generates a detection signal Sd when the voltage Vd of the battery 63 drops below a voltage V12 (to be described later) or a detection signal Su when it exceeds a voltage V11 (to be described later).

A display driver 58 receives display data from the control unit 54, and displays the data on a display unit 59 constructed from an LCD panel or the like. A key input unit 60 is constructed from various key switches (for example, a power switch and a reset key), and generates a switch signal that matches the operation of each key switch. A driver 61, in response to an annunciator driving signal supplied from the control unit 54, drives a speaker 71 that produces an alerting sound indicating the arrival of an incoming call, a vibrator 72 that produces vibration to indicate the arrival of an incoming call, and an LED 73 that illuminates when an incoming call arrives. A voltage raising circuit 62 is constructed from a DC/DC converter, and raises the voltage of the battery 63 for output during high load operation. The high load operation here refers, for example, to the operation in which the driver 61 drives any one of the annunciators, the speaker 71, the vibrator 72, or the LED 73, when an incoming call arrives.

Next, the voltage judging operation in the paging receiver 50 will be described with reference to FIGS. 14 and 15.

First, when the power switch on the key input unit 60 is turned on, the control unit 54 performs initialization and enters an intermittent receive mode to wait for the arrival of an incoming call. When an incoming radiowave is detected, thus detecting the arrival of an incoming call, the address data of the detected incoming radiowave is compared with the address data stored in the ID-ROM 52 to determine whether they match or not. If the two addresses match, processing is performed to capture the received data into a receive buffer. Upon recognizing, as a result of the signal capturing processing, that the paging is addressed to the paging receiver 50, the control unit 54 supplies an annunciator driving signal to the driver 61 which thus drives the speaker 71, the vibrator 72, or the LED 73 to annunciate the incoming call.

When the high load operation for driving the speaker 71, the vibrator 72, or the LED 73 is performed in this way, the voltage Vd of the battery 63 begins to drop at time t101 at which the high load operation is started, as shown in FIG. 15. The battery voltage Vd drops to the voltage V12 at time t102 at which the high load operation ends. At the high load operation end time t102, the internal timer of the control unit 54 is started. At voltage judging time t103 when a predetermined time has elapsed, the voltage measuring circuit 57 measures the battery voltage Vd.

Starting from the high load operation end time t102, the battery voltage Vd gradually recovers and rises. At the voltage judging time t103, if the battery voltage Vd is higher than the voltage V11 (as indicated by the voltage characteristic BT1), the operation continues by returning to the incoming call waiting state. On the other hand, at the voltage judging time t103, if the battery voltage Vd is not higher than the voltage V11 (as indicated by the voltage characteristic BT2), it is determined that the battery 63 is unable to drive the load. Then, a message saying, for example, "BATTERY IS LOW. REPLACE BATTERY." is displayed on the display unit 59, urging the user to replace or recharge the battery, while stopping the operation of the reception processing unit 51.

In this way, the prior art electronic apparatus equipped with the voltage judging means disclosed in Patent Document 1 checks the voltage recovery state when a predetermined time has elapsed after stopping the high load operation. Accordingly, the prior art electronic apparatus can avoid to a certain extent the problem of immediately stopping the operation or urging the user to replace the battery by determining that the battery is low even when the battery voltage just drops temporarily.

The electronic apparatus equipped with the prior art voltage judging means disclosed in Patent Document 1 judges the voltage after a predetermined time (voltage recovery period) has elapsed after stopping the high load operation. Accordingly, when the battery is in a nearly fully charged condition, for example, since the battery recovers quickly after stopping the high load operation, time loss occurs in judging the recovery state of the battery. As a result, when driving a load repeatedly, or when driving a plurality of loads sequentially in succession, there arises the serious problem that the load or loads cannot be driven quickly.

Furthermore, since the voltage recovery characteristic of the battery after stopping the high load operation greatly varies depending on ambient temperature and other load driving conditions, it is difficult to accurately judge the recovery state of the battery with the prior art judging method that measures the voltage only once after the predetermined time (voltage recovery period) has elapsed. Such a judging method requires that the detection margin be increased in order to compensate for the poor accuracy in the detection of the battery recovery state. However, if the detection margin is increased, the voltage recovery period has to be set longer, which makes it further difficult to achieve high speed load driving, and an electronic apparatus having excellent response characteristics cannot be achieved. If such a prior art power supply system is applied to a portable electronic apparatus that requires a compact and thin design, the operation will become unstable because of insufficient capacity of the power supply, and it is extremity difficult to achieve a highly reliable product.

It is also known to provide a battery-driven power tool equipped with a battery-driven power source (motor) and having a remaining capacity detection circuit that detects the remaining capacity of the battery (refer to Patent Document 2). This remaining capacity detection circuit judges the remaining capacity of the battery by detecting whether the time rate of change of battery voltage when a predetermined time has elapsed after power is turned off to the power source exceeds a predetermined value. Accordingly, in the battery-driven power tool disclosed in Patent Document 2, the remaining capacity of the battery can be detected with relatively good accuracy by minimizing the effects due to the condition (such as the load condition) of the power source.

The electronic apparatus disclosed in Patent Document 2 is designed to judge the remaining capacity of the battery by the time rate of change of battery voltage when a predetermined time has elapsed after power is turned off to the power source. However, in the electronic apparatus disclosed in Patent Document 2, when, for example, the battery is in a nearly fully charged condition, and the battery recovers quickly after turning off power to the power source, time loss occurs in judging the recovery state of the battery, as in the case of the electronic apparatus disclosed in Patent Document 1. Accordingly, the electronic apparatus disclosed in Patent Document 2 involves the same problem as the electronic apparatus disclosed in Patent Document 1, that is, the power source such as the motor cannot be quickly operated repeatedly.

Patent Document 1: Japanese Unexamined Patent Publication No. 2000-156722 (page 4, FIG. 1)

Patent Document 2: Japanese Unexamined Patent Publication No. 2003-25252 (page 6, FIG. 2)

SUMMARY OF THE INVENTION

It is an object of the present invention to provide an electronic apparatus that can solve the above problem.

It is also an object of the present invention to provide an electronic apparatus that can achieve high-speed continuous driving of a load by quickly judging the recovery state of a battery after driving the load.

It is a further object of the present invention to provide a compact and highly reliable electronic apparatus that can be driven by a small-capacity battery.

An electronic apparatus according to the present invention includes a power supply, a load, load driver for driving the load by the power supply, power supply state detector for outputting power supply recovery information by measuring physical quantity of the power supply at predetermined intervals of time after the driving of the load is stopped, and a controller for instructing the load driver to drive the load, based on the power supply recovery information supplied from the power supply state detector. With this configuration, the recovery state of the battery can be judged quickly after stopping the driving of the load. Accordingly, the electronic apparatus according to the present invention can advance the timing of the next load driving in accordance with the recovery state of the battery, can achieve high-speed continuous driving of the load, and can perform highly reliable driving using a small-capacity battery.

Preferably, in the electronic apparatus according to the present invention, the power supply state detector compares the physical quantity of the power supply with a reference value at the predetermined intervals of time and, when the physical quantity of the power supply exceeds the reference value, outputs the power supply recovery information as determines that the power supply has recovered sufficiently to be able to drive the load, and the load driver resumes the driving of the load in accordance with the drive instruction supplied from the control means. Since the recovery state of the power supply is judged by comparing the physical quantity of the power supply with the reference value at the predetermined intervals of time, the recovery state of the power supply can be detected accurately and quickly, and high-speed driving of the load can be achieved.

Preferably, in the electronic apparatus according to the present invention, the power supply state detector makes the measurement at intervals of time shorter than a recovery time that the power supply takes to recover sufficiently to be able to drive the load. With this configuration, since the recovery state of the power supply after stopping the driving of the load can be measured meticulously and accurately, high-speed and highly reliable driving of the load can be achieved.

Preferably, in the electronic apparatus according to the present invention, the controller varies the predetermined intervals of time at which the power supply state detector makes the measurement and/or the reference value in accordance with the recovery state of the power supply. With this configuration, since the power supply measuring time intervals can be properly set by making the measuring time intervals shorter when the power supply can recover quickly and longer when the power supply is slow to recover, the battery life of the electronic apparatus can be extended by reducing wastage of power consumption due to needless measurement operations.

Preferably, in the electronic apparatus according to the present invention, the controller sets the predetermined intervals of time differently toward the end of the measurement than at the beginning of the measurement. With this configuration, since the measuring time intervals can be properly adjusted in accordance with the recovery state of the power supply, not only can the measurement be made with high accuracy, but the battery life of the electronic apparatus can be extended by reducing wastage of power consumption due to needless measurement operations.

Preferably, in the electronic apparatus according to the present invention, the control means varies the detection frequency with which the power supply state detector performs detection, in accordance with the recovery state of the power supply. With this configuration, since the power supply detection frequency after stopping the driving of the load is varied in accordance with the recovery state of the power supply, the load can be driven continuously in accordance with the recovery state of the power supply, and high-speed driving of the load can thus be achieved.

Preferably, in the electronic apparatus according to the present invention, when the measurement has been performed a predetermined number of times, or when a predetermined time has elapsed from the start of the measurement, if it is determined that the power supply has not recovered sufficiently to be able to drive the load, the controller causes the electronic apparatus to move to a power recovery mode in which priority is given to making the power supply recover. With this configuration, when the power supply becomes unable to drive the load because of reduced power supply capacity, the electronic apparatus can be made to move to the power supply recovery mode for the power supply to recover, or can be switched to a light load driving mode to prevent overdischarging of the power supply.

Preferably, in the electronic apparatus according to the present invention, the load has different driving conditions, and the controller varies one or all of the predetermined intervals of time, the predetermined number of times, the predetermined elapsed time, and the reference value in accordance with the driving conditions of the load. Since the recovery state of the power supply after stopping the driving of the load can be properly measured and evaluated for the load having different driving conditions, the timing for driving the load can be advanced in accordance with the recovery state of the power supply. Accordingly, with this configuration, high-speed driving can be achieved that matches the load having different driving conditions.

Preferably, the electronic apparatus according to the present invention further includes storage for storing past detection conditions including the predetermined intervals of time, the reference value, the predetermined number of times, or the predetermined elapsed time. With this configuration, by storing the detection conditions for the power supply state detecter and by retrieving the stored contents, the drive instruction for the next load driving and the detection conditions for detecting the recovery state of the power supply can be properly determined.

Preferably, in the electronic apparatus according to the present invention, the control means varies, based on the past detection conditions stored in the storage, one or all of the predetermined intervals of time, the reference value, and measurement start time to be allowed after stopping the driving of the load until starting the measurement. Since the most recent recovery state of the power supply is checked by retrieving the detection information from the storage, and since the detection conditions for the next load driving are varied in accordance with the thus checked power supply recovery state, the detection accuracy of the power supply recovery state can be enhanced, while reducing the loss of the measurement operation.

Preferably, in the electronic apparatus according to the present invention, the load is constructed to be driven intermittently, and the controller, based on the past detection conditions stored in the storage, adjusts intervals at which the load is driven intermittently, and instructs the load driver to drive the load intermittently at the adjusted intervals.

Preferably, the electronic apparatus according to the present invention further includes storage for storing past detection conditions concerning the predetermined intervals of time, the reference value, the predetermined number of times, or the predetermined elapsed time, and the controller varies, based on the past detection conditions stored in the storage, the detection frequency with which the power supply state detecter performs detection. Since the most recent recovery state of the power supply is checked by retrieving the detection information from the storage, and since the detection frequency with which to detect the recovery of the power supply after stopping the driving of the load is varied based on the retrieved information, the load can be driven continuously in accordance with the recovery state of the power supply, and thus high-speed driving of the load can be achieved.

Preferably, in the electronic apparatus according to the present invention, the electronic apparatus has a plurality of loads, the load driver drives the plurality of loads individually, the power supply state detector outputs the power supply recovery information for the plurality of loads by measuring the physical quantity of the power supply for the plurality of loads at predetermined intervals of time after the driving of each of the plurality of loads is stopped, and the controller instructs the load driver to drive the plurality of loads individually, based on the power supply recovery information supplied from the power supply state detector. With this configuration, since the recovery state of the power supply can be judged quickly after stopping the driving of each of the plurality of loads, the timing of the next load driving can be advanced in accordance with the recovery state of the power supply, and thus high-speed driving can be achieved for the plurality of loads.

Preferably, in the electronic apparatus according to the present invention, the plurality of loads have different characteristics, and the controller sets one or all of the predetermined intervals of time, the predetermined number of times, the predetermined elapsed time, and the reference value individually for the plurality of loads. Since the recovery state of the power supply after stopping the driving of the respective loads can be properly measured and evaluated for the plurality of loads having different characteristics, the timing for driving the respective loads can be advanced in accordance with the recovery state of the power supply, and thus high-speed driving can be achieved for the plurality of loads having different characteristics.

Preferably, in the electronic apparatus according to the present invention, the plurality of loads have different driving conditions, and the controller sets one or all of the predetermined intervals of time, the predetermined number of times, the predetermined elapsed time, and the reference value individually in accordance with the driving conditions. Since the recovery state of the power supply after stopping the driving of the respective loads can be properly measured and evaluated for the loads having different driving conditions, the timing for driving the respective loads can be advanced in accordance with the recovery state of the power supply, and high-speed driving can be achieved for the plurality of loads having different driving conditions.

Preferably, the electronic apparatus according to the present invention further includes storage for storing past detection conditions including the predetermined intervals of time, the reference value, the predetermined number of times, or the predetermined elapsed time for the plurality of loads, wherein based on the past detection conditions stored in the storage, the controller varies, for each of the plurality of loads, one or all of the predetermined intervals of time, measurement start time to be allowed after stopping the driving of each of the plurality of loads until starting the measurement, the reference value, the predetermined number of times, the predetermined elapsed time, and the detection frequency with which the power supply state detector performs detection. Since the most recent recovery state of the power supply can be checked for each of the plurality of loads by retrieving the detection information from the storage, and since the detection information can be shared among the plurality of loads, the detection conditions and detection frequency can be properly varied for each load based on the detection information. Accordingly, even when driving the loads by a small-capacity battery, high-speed driving that matches the plurality of loads can be achieved, and wastage of power consumption can be reduced.

Preferably, in the electronic apparatus according to the present invention, the power supply is a battery, the physical quantity that the power supply state detector measures is the battery voltage of the battery, and the reference value is a reference voltage.

Preferably, in the electronic apparatus according to the present invention, the load is any one of a motor, a vibrator, an audio device, an illumination device, a display device, a communication device, an imaging device, or a sensor.

According to the present invention, since the recovery state of the battery can be judged quickly after stopping the driving of the mounted load, it has become possible to advance the timing of the next load driving in accordance with the recovery state of the battery.

Further, according to the present invention, it has become possible to achieve high-speed continuous driving of the load.

Furthermore, according to the present invention, it has become possible to achieve highly reliable driving of the load using a small-capacity battery.

It has also becomes possible to achieve highly reliable driving of the load without having to employ a technique that enhances the detection accuracy of the battery recovery state by mounting a temperature sensor for measuring the ambient temperature of the battery. Mounting such a temperature sensor would not be advantageous as it would lead to increased system size and increased power consumption.

BRIEF DESCRIPTION OF THE DRAWINGS

FIG. 15 is a characteristic diagram of a battery mounted in the prior art paging receiver.

DETAILED DESCRIPTION OF THE PREFERRED EMBODIMENT

Embodiments of the present invention will be described in detail below with reference to the drawings.

Figure 1:
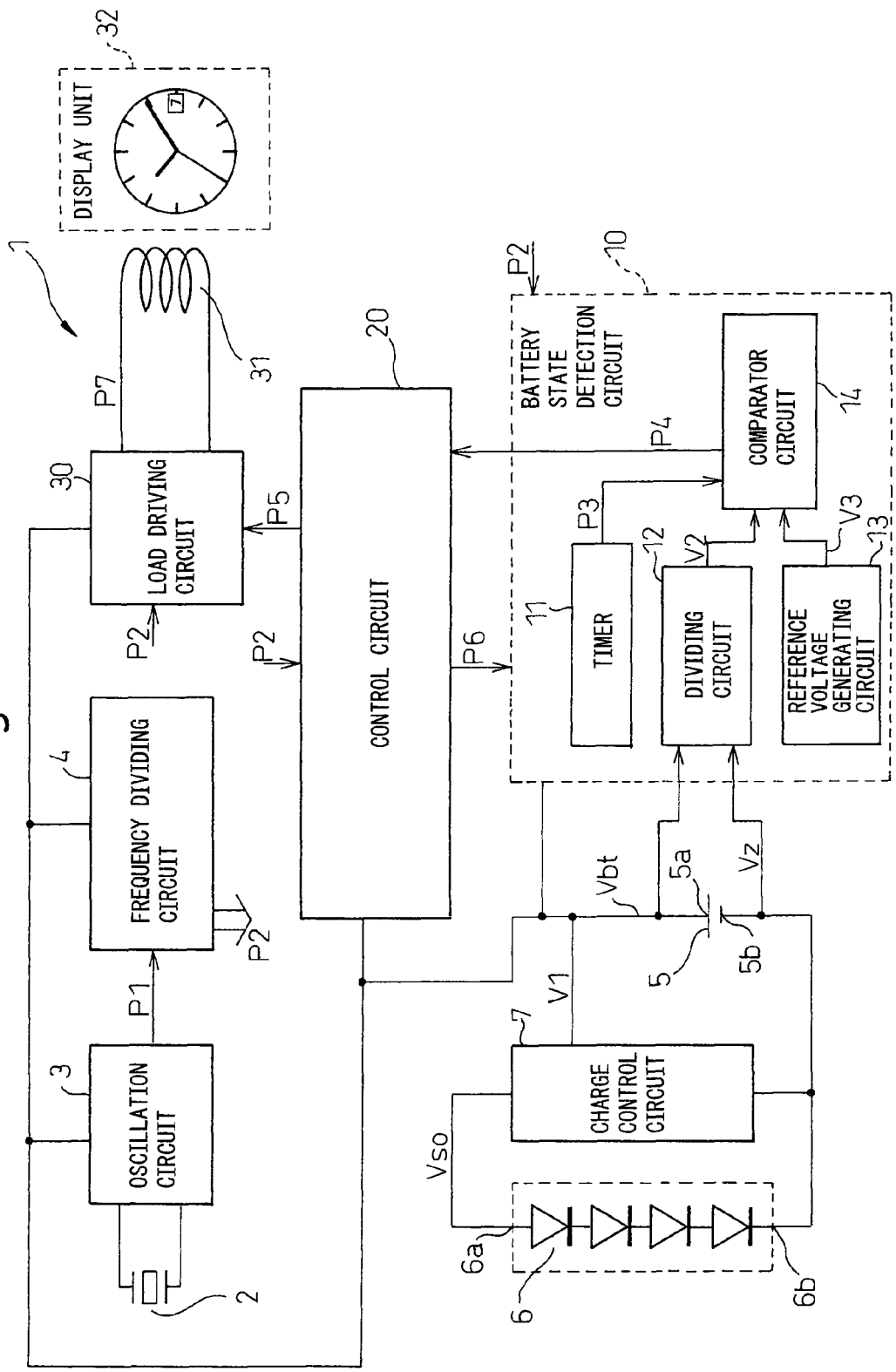
FIG. 1 is a diagram schematically showing the configuration of an electronic watch as an electronic apparatus according to the present invention.

FIG. 1 is a diagram schematically showing the configuration of an electronic watch as an electronic apparatus according to a first embodiment of the present invention.

In the electronic watch 1 shown in FIG. 1, the hour, minute, and second hands on the display unit are driven by a single motor. In FIG. 1, an oscillation circuit 3 causes a quartz crystal 2 as a reference signal source to oscillate and thus output a reference clock P1. A frequency dividing circuit 4 takes the reference clock P1 as an input and outputs a second signal P2 of 1 Hz.

A battery 5 as a power supply is a small secondary battery, and preferably a lithium-ion battery. However, the kind of the battery used as the battery 5 is not limited to a lithium-ion battery. The voltage at the positive terminal 5a of the battery 5 is the battery voltage Vbt, and the voltage at the negative terminal 5b is a zero voltage Vz. The voltage at the positive terminal 6a of a solar battery 6 is the solar voltage Vso, and the negative terminal 6b is connected to the negative terminal 5b of the battery 5. Based on the solar voltage Vso supplied from the solar battery 6, a charge control circuit 7 applies a charge voltage V1 to the positive terminal 5a of the battery 5. Thus, the battery voltage Vbt as the output of the battery 5 and the charge voltage V1 are at the same potential.

A battery state detection circuit 10 as a power supply state detecting means comprises a timer 11, a dividing circuit 12, a reference voltage generating circuit 13, and a comparator circuit 14. The dividing circuit 12 is connected to the positive terminal 5a and negative terminal 5b of the battery 5, and outputs a battery dividing voltage V2 by dividing the potential difference between the battery voltage Vbt and the zero voltage Vz (i.e., the electromotive force of the battery 5) by a prescribed factor. The reference voltage generating circuit 13 is constructed from a D/A conversion circuit, and outputs a prescribed reference voltage V3. The comparator circuit 14 is constructed from an analog comparator, and outputs a battery recovery signal P4 as battery recovery information by comparing the battery dividing voltage V2 with the reference voltage V3 each time a timer signal P3 is output from the timer 11.

In the present embodiment, the battery state detection circuit 10 is constructed mainly from analog circuits. Alternatively, it may be constructed to output the battery recovery signal P4 by digital processing, for example, by converting the battery voltage Vbt of the battery 5 into a digital signal and comparing the digital signal with the reference value.

A control circuit 20 as a control means for controlling the entire operation of the electronic watch 1 operates by executing firmware stored in its internal ROM (not shown). The control circuit 20 generates a motor control signal P5 for output, based on the second signal P2 supplied from the frequency dividing circuit 4. Further, the control circuit 20 generates a battery detection control signal P6 based on the battery recovery signal P4 supplied from the battery state detection circuit 10, and outputs the battery detection control signal P6 to the battery state detection circuit 10.

A load driving circuit 30 as a load driving means takes the motor control signal P5 as an input and generates a motor driving signal P7 for output. A stepping motor 31 (hereinafter simply called "the motor") is driven by the motor driving signal P7 and drives the hour, minute, and second hands on the display unit 32.

As shown, the battery voltage Vbt output from the battery 5 is supplied to the oscillation circuit 3, the frequency dividing circuit 4, the control circuit 20, the load driving circuit 30, and the battery state detection circuit 10, and is used to power the respective circuits. The zero voltage Vz of the battery 5 is also connected to the respective circuits, but the connections are not shown here. Preferably, the circuits constituting the electronic watch 1 are implemented on a single-chip microcomputer, but the implementation of the circuits need not be limited to a single-chip microcomputer.

Next, the operation of the electronic watch 1 shown in FIG. 1 will be described.

First, an overview of the time-keeping operation of the electronic watch 1 will be given. In FIG. 1, when the solar battery 6 is exposed to ambient light, the solar battery 6 generates power and produces an electromotive force which is supplied as the solar voltage Vso to the charge control circuit 7. Upon receiving the solar voltage Vso, the charge control circuit 7 outputs the charge voltage V1 and thus starts to charge the battery 5. When the battery 5 is charged, and the battery voltage Vbt reaches a specified voltage, the oscillation circuit 3 starts operating to drive the quartz crystal 2 and output the reference clock P1.

The frequency dividing circuit 4 frequency-divides the reference clock P1, and outputs a timing signal P2 which is supplied to the control circuit 20, the load driving circuit 30, and the battery state detection circuit 10. The timing signal P2 includes a signal, for example, a signal of 1 Hz, necessary for the operation of each of the above-mentioned circuits. The control circuit 20 outputs the motor control signal P5 synchronized to the thus supplied timing signal P2.

The load driving circuit 30, based on the supplied timing signal P2 and motor control signal P5, outputs the motor driving signal P7 to drive the motor 31 so as to advance the second hand on the display unit 32 by one second. The motor driving signal P7 for driving the motor 31 is one that consumes the largest current in the electronic watch 1. Accordingly, each time the motor driving signal P7 is output, a large current is supplied from the battery 5 to the load driving circuit 30, and the battery voltage Vbt of the battery 5 temporarily drops.

The battery state detection circuit 10 has the function of judging the recovery state of the battery 5 by detecting the change in the battery voltage Vbt associated with the driving of the motor 31. The operation of the battery state detection circuit 10 will be briefly described below.

Each time the battery detection control signal P6 is output from the control circuit 20, the timer 11 in the battery state detection circuit 10 is set to a predetermined timer value and starts counting based on the timing signal P2. When the count value of the timer 11 reaches zero, the timer signal P3 is output. Instead of receiving the timing signal P2, the timer 11 may contain an internal signal source.

The comparator circuit 14 compares the battery dividing voltage V2 with the reference voltage V3 in synchronism with the timer signal P3, and outputs the battery recovery signal P4 as battery recovery information if the battery dividing voltage V2 is higher than the reference voltage V3. The comparator circuit 14 is configured to compare the battery dividing voltage V2 with the reference voltage V3 in intermittent fashion based on the timer signal P3 from the timer 11, but the dividing circuit 12 and the reference voltage generating circuit 13 may also be configured to operate in intermittent fashion based on the timer signal P3. Operating both the dividing circuit 12 and the reference voltage generating circuit 13 in intermittent fashion is preferable because the battery state detection circuit 10 can then be operated at low power.

Since the battery dividing voltage V2 is a voltage obtained by dividing in a manner accurately proportional to the battery voltage Vbt, the operation of the comparator circuit 14 is equivalent to comparing the battery voltage Vbt with the reference voltage V3. The reference voltage V3 is set to a voltage value such that, when the battery dividing voltage V2 exceeds the reference voltage V3, it can be determined that the battery 5 has recovered to a level that can drive the motor 31 as a load. In other words, when the battery recovery signal P4 is output from the comparator circuit 14, this indicates that the battery 5 has recovered sufficiently to be able to drive the motor 31. Accordingly, when the battery recovery signal P4 is input, the control circuit 20 recognizes that the battery 5 has recovered sufficiently to be able to drive the motor 31, and proceeds to execute the next cycle of motor driving. The reference voltage V3 here can be varied as desired by the battery detection control signal P6 that the control circuit 20 outputs.

When continuously performing the high load driving operation, such as when continuously driving the motor 31 fast forward in order, for example, to adjust the time on the electronic watch 1, the recovery state of the battery 5 must be accurately judged. Otherwise, the battery 5 may be overdischarged, resulting in an abnormal decrease of the battery voltage Vbt, and the operation of the electronic watch 1 may stop. In this way, an important point of the present invention is to properly detect the state of the battery 5 during the high load driving operation such as when driving the motor 31 fast forward, and to achieve safe and quick driving of the load in accordance with the recovery state of the battery 5.

Figure 2:
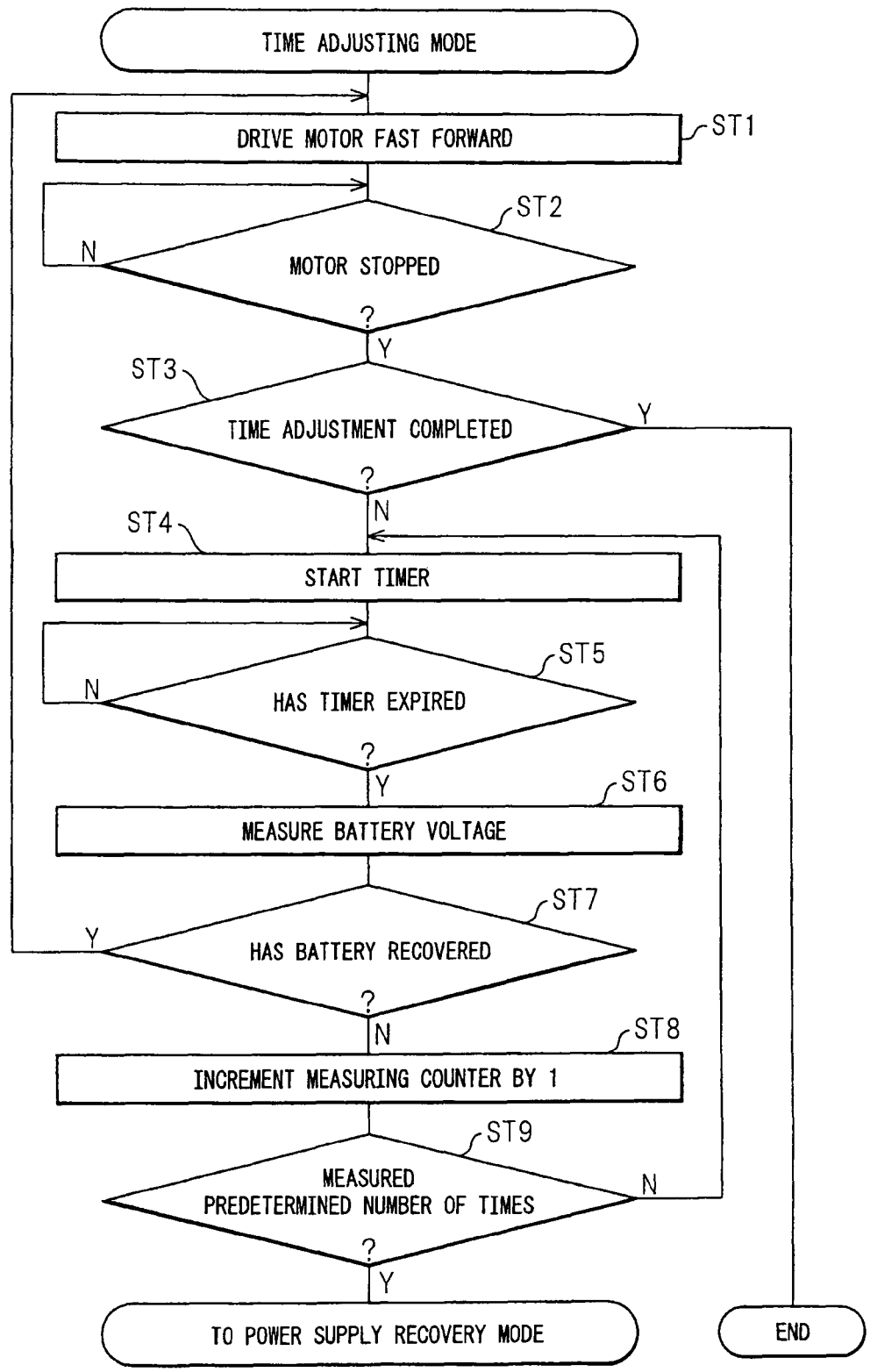
FIG. 2 is a flowchart explaining the basic operation of the electronic watch.

FIG. 2 is a flowchart for explaining the basic operation of the electronic watch.

Referring to the flowchart of FIG. 2, one example of the battery state detection operation performed during the fast forward driving of the motor 31 will be described in detail below.

First, the electronic watch 1 is set, for example, to a time adjusting mode to adjust the time, and the motor 31 is driven fast forward (step ST1). Usually, this fast forward driving is performed by outputting 60 pulses of the motor driving signal P7 in one fast forward driving operation and thereby causing the second hand to make one revolution, that is, advancing the second hand by one minute.

Next, the control circuit 20 of the electronic watch 1 determines whether the one fast forward driving operation (for adjusting the time forward by one minute) is completed or not, that is, whether the motor 31 has stopped or not (step ST2). If the answer is NO, the process waits until the motor 31 stops, and if the answer is YES (the motor 31 has stopped), the process proceeds to the next step.

Next, the control circuit 20 of the electronic watch 1 determines whether the time adjustment is completed or not (step ST3). If the answer is YES, the fast forward driving of the motor 31 is stopped, and the time adjusting mode is terminated; if the answer is NO (the time adjustment is not completed yet), the process proceeds to the next step.

Next, the control circuit 20 of the electronic watch 1 outputs the battery detection control signal P6, and thus sets the timer 11 in the battery state detection circuit 10 to a predetermined value (that defines a time interval during which to measure the battery voltage) and causes the timer 11 to start counting down (step ST4).

The battery state detection circuit 10 of the electronic watch 1 waits until the timer 11 counts down to zero and, when the count value reaches zero (that is, the timer expires), the timer 11 outputs the timer signal P3 (step ST5).

Then, in response to the timer signal P3, the comparator circuit 14 in the battery state detection circuit 10 of the electronic watch 1 compares the battery dividing voltage V2 with the reference signal V3 (step ST6). That is, each time the timer 11 expires and outputs the timer signal P3, the comparator circuit 14 determines whether or not the battery dividing voltage V2 obtained by dividing the battery voltage Vbt is higher than the reference signal V3.

Next, the control circuit 20 of the electronic watch 1 determines whether or not the battery recovery signal P4 has been output from the battery state detection circuit 10 (that is, whether or not the battery 5 has recovered sufficiently to be able to drive the motor 31) (step ST7). If the answer is YES, the process returns to step ST1 to resume the fast forward driving of the motor 31, and the process from step ST1 to step ST7 is repeated. If the answer is NO (not recovered yet), the process proceeds to the next step.

If the answer in step ST7 is NO, the control circuit 20 of the electronic watch 1 increments its internal measuring counter (not shown) by 1 (step ST8).

Next, the control circuit 20 of the electronic watch 1 determines whether or not the measuring counter has counted up to a predetermined value (which indicates a predetermined number of times of the measurement) (step ST9). If the answer is NO, that is, if the predetermined number of times is not reached yet, the process returns to step ST4 to continue the measurement of the battery voltage Vbt, and the process from step ST4 to step ST9 is repeated until the predetermined number of times is reached.

If the answer in step ST9 is YES, the control circuit 20 moves to a power supply recovery mode by determining that, even after performing the measurement the predetermined number of times, the battery 5 has not recovered sufficiently to be able to execute the next cycle of fast forward driving. In the power supply recovery mode, the fast forward driving of the motor is stopped, and an alarm indication (for example, the second hand is advanced by two seconds) is produced to warn the user that the battery capacity is low, thus actively urging the user to recharge the battery 5. During the power recovery mode, high load driving operations such as the one performed in the time adjusting mode are not performed until the battery 5 is recharged.

In steps ST8 and ST9, the number of times that the measurement made is counted when determining whether the battery 5 has recovered or not, but the battery recovery control method is not limited to this specific one. For example, the time elapsed from the start of the measurement may be measured, and control may be performed to move to the power supply recovery mode when the battery recovery signal P4 is not output even after a predetermined time has elapsed. Furthermore, since the predetermined number of times of the measurement or the predetermined elapsed time based on which to judge the recovery state of the battery 5 can be varied by the control circuit 20, these parameters may be varied in accordance with the power supply specification of the electronic watch 1.

Figure 3:
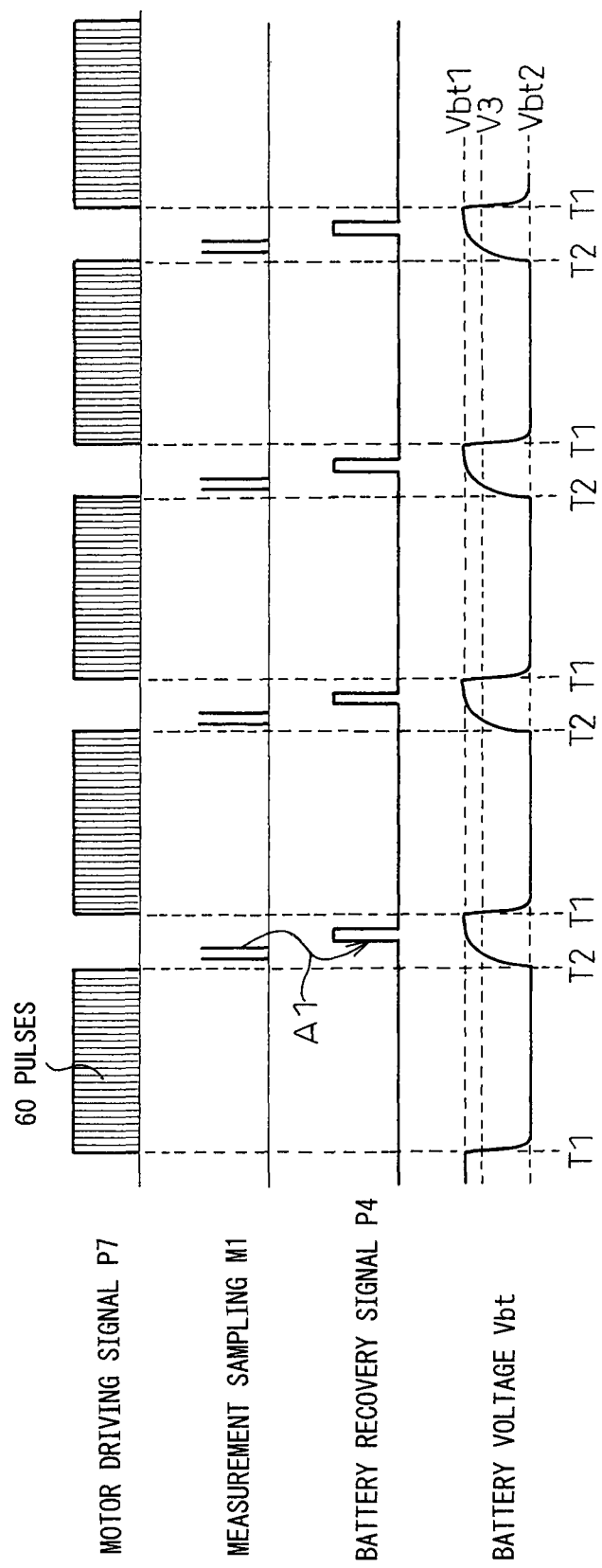
FIG. 3 is a timing chart explaining the load driving operation in the electronic watch when its battery is in a fully charged condition.

FIG. 3 is a timing chart explaining the load driving operation in the electronic watch when the battery is in a fully charged condition.

Referring to the timing chart of FIG. 3, a description will be given of one example of the fast forward driving of the motor when the battery 5 is in a nearly fully charged condition.

First, suppose that the electronic watch 1 is set to the time adjusting mode and the motor driving signal P7 is output to start the fast forward driving of the motor (timing T1). As earlier described, one fast forward driving operation of the motor is performed by outputting 60 pulses of the motor driving signal P7 and thereby causing the second hand to make one revolution. This fast forward driving operation consumes high power from the battery 5. Accordingly, during the period from the start (timing T1) of the fast forward driving to the end (timing T2) of one fast forward driving operation, the battery voltage Vbt drops to the voltage Vbt2 as shown in the figure.

Next, when the one fast forward driving operation ends (timing T2), the battery state detection circuit 10 starts to measure the battery voltage Vbt. That is, the measurement by the comparator circuit 14 (that is, the comparison between the battery dividing voltage V2 and the reference voltage V3) is preformed at predetermined intervals of time under the control of the timer 11. Measurement sampling M1 shown in FIG. 3 shows the timing with which the measurement is preformed by the comparator circuit 14 at the predetermined intervals of time. Since the battery 5 is in a nearly fully charged condition, the battery voltage Vbt of the battery 5 quickly rises to the no-load voltage Vbt1 after the end of the fast forward driving operation. Accordingly, by the second timing of the measurement sampling M1, the battery voltage Vbt of the battery 5 has risen to a level higher than the reference voltage V3 by reference to which the battery recovery state is judged.

The battery recovery signal P4 is output from the comparator circuit 14 in synchronism with the second timing of the measurement sampling M1 (as indicated by arrow A1). When the battery recovery signal P4 is received, the control circuit 20 determines that the battery 5 has recovered, and instructs the battery state detection circuit 10 to stop the measurement. Further, the control circuit 20 outputs the motor control signal P5 as a drive instruction for the next fast forward driving operation, and resumes the fast forward driving of the motor 31 (next timing T1). Thereafter, the timings T1, T2, T1, T2, etc. are repeated in sequence, as long as the fast forward driving of the motor 31 continues.

In this way, when the battery 5 is in a nearly fully charged condition, the battery recovery can be quickly detected after the start of the measurement sampling M1. As a result, the repeating cycle of the fast forward driving (the period from one timing T1 to the next timing T1) becomes almost equal to the fast forward driving period (that is, the period from timing T1 to timing T2), thus achieving the speedup of the fast forward driving.

Figure 4:
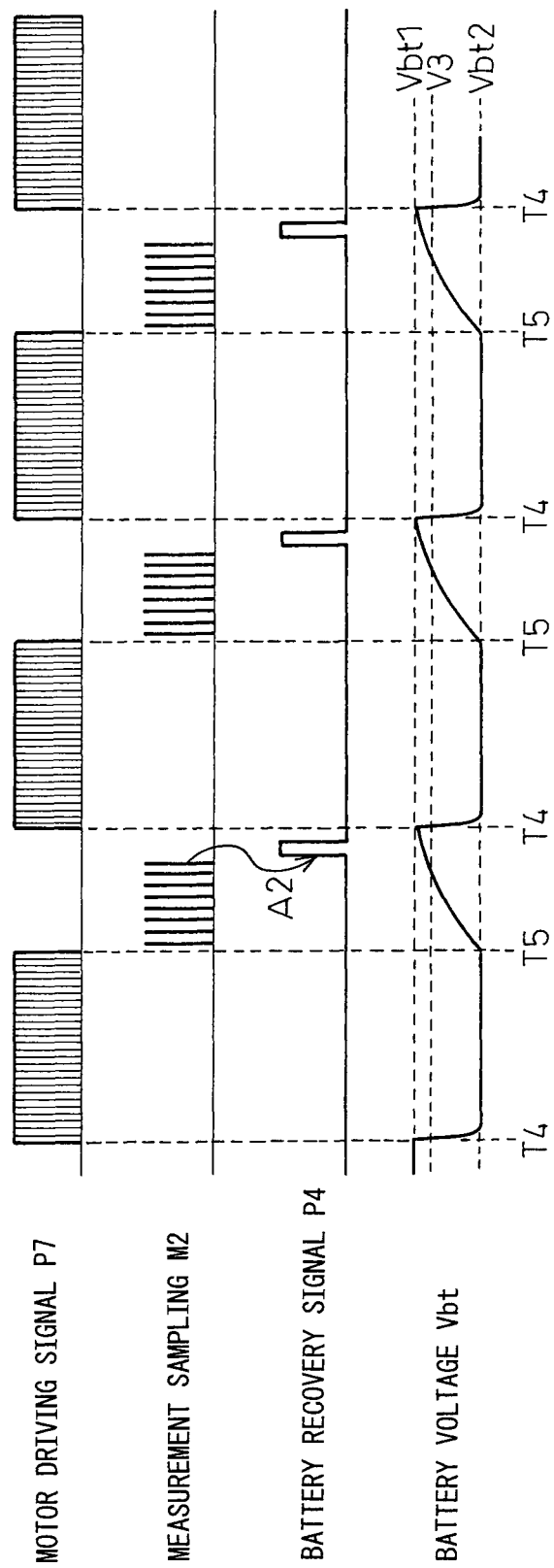
FIG. 4 is a timing chart explaining the load driving operation in the electronic watch when its battery is in a medium state of charge condition.

FIG. 4 is a timing chart explaining the load driving operation in the electronic watch when the battery is in a medium state of charge condition.

Referring to the timing chart of FIG. 4, a description will be given of one example of the fast forward driving of the motor when the battery 5 is in a medium state of charge condition.

First, suppose that the electronic watch 1 is set to the time adjusting mode and the motor driving signal P7 is output to start the fast forward driving of the motor (timing T4). This fast forward driving operation consumes high power from the battery 5. Accordingly, during the period from the start (timing T4) of the fast forward driving to the end (timing T5) of one fast forward driving operation, the battery voltage Vbt drops to the voltage Vbt2 as shown in the figure.

Next, when the one fast forward driving operation ends (timing T5), the battery state detection circuit 10 starts to measure the battery voltage Vbt. The measurement by the comparator circuit 14 (that is, the comparison between the battery dividing voltage V2 and the reference voltage V3) is preformed at predetermined intervals of time under the control of the timer 11. Measurement sampling M2 shown in FIG. 4 shows the timing with which the measurement is preformed by the comparator circuit 14 at the predetermined intervals of time. Since the battery 5 is in a medium state of charge condition, the battery voltage Vbt of the battery 5 rises to the no-load voltage Vbt1 over a certain length of time after the end of the fast forward driving operation. Accordingly, only after the measurement sampling M2 has been repeated several times, can the battery voltage Vbt of the battery 5 exceed the reference voltage V3 by reference to which the battery recovery state is judged.

After the measurement sampling M2 has been repeated at predetermined intervals of time, the battery recovery signal P4 is output from the comparator circuit 14 in synchronization with the timing when the battery voltage Vbt exceeds the reference voltage V3 (as indicated by arrow A2). When the battery recovery signal P4 is received, the control circuit 20 determines that the battery 5 has recovered, and instructs the battery state detection circuit 10 to stop the measurement. Next, the control circuit 20 outputs the motor control signal P5 as a drive instruction for the next fast forward driving operation, and resumes the fast forward driving of the motor 31 (next timing T4). Thereafter, the timings T4, T5, T4, T5, etc. are repeated in sequence, as long as the fast forward driving of the motor 31 continues.

In this way, when the battery 5 is in a medium state of charge condition, the measurement sampling M2 is repeated several times until the battery 5 recovers and, when the battery 5 has recovered, the recovery of the battery 5 can be quickly detected. As a result, while the repeating cycle of the fast forward driving (the period from one timing T4 to the next timing T4) becomes longer than that when the battery 5 is in a nearly fully charged condition shown in FIG. 3, the fast forward driving can be repeatedly performed in the shortest possible time in accordance with the recovery state of the battery 5.

Figure 5:
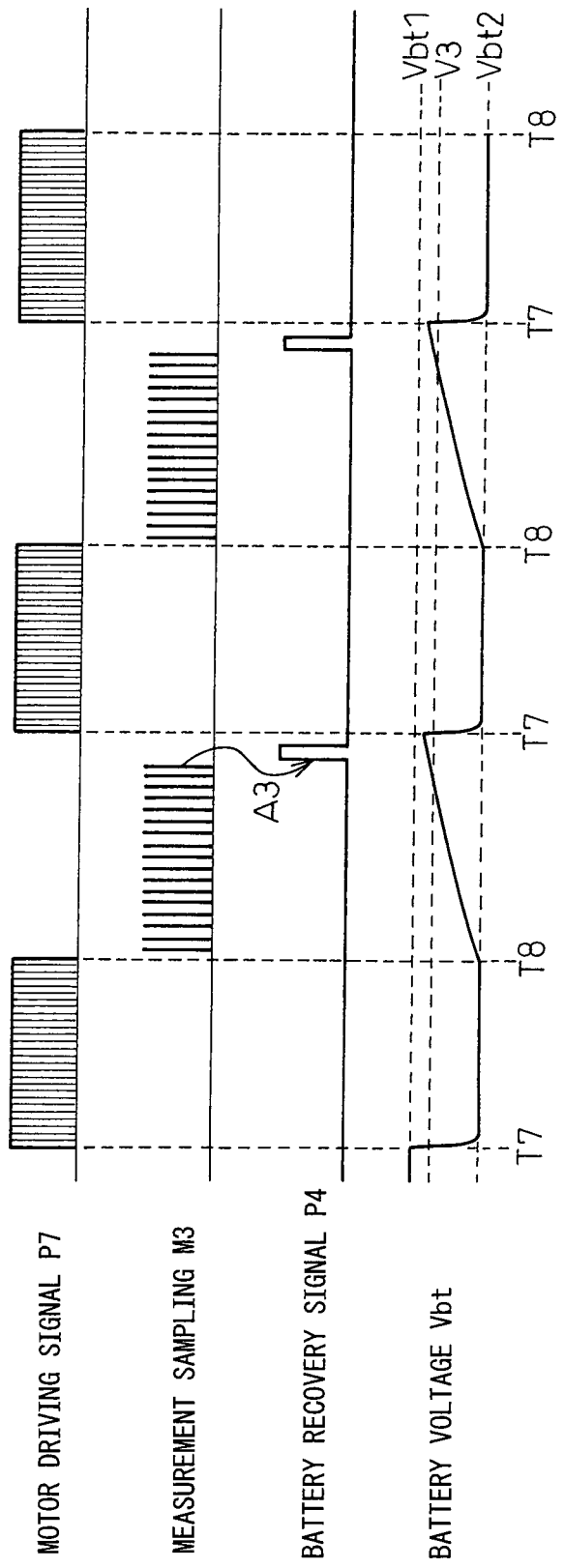
FIG. 5 is a timing chart explaining the load driving operation in the electronic watch when the battery state of charge is low.

FIG. 5 is a timing chart for explaining the load driving operation in the electronic watch when the state of charge of the battery is low.

Referring to the timing chart of FIG. 5, a description will be given of one example of the fast forward driving of the motor when the state of charge of the battery 5 is low.

First, suppose that the electronic watch 1 is set to the time adjusting mode and the motor driving signal P7 is output to start the fast forward driving of the motor (timing T7). This fast forward driving operation consumes high power from the battery 5. Accordingly, during the period from the start (timing T7) of the fast forward driving to the end (timing T8) of one fast forward driving operation, the battery voltage Vbt drops to the voltage Vbt2 as shown in the figure.

Next, when the one fast forward driving operation ends (timing T8), the battery state detection circuit 10 starts to measure the battery voltage Vbt. In other words, the measurement by the comparator circuit 14 (i.e., the comparison between the battery dividing voltage V2 and the reference voltage V3) is preformed at predetermined intervals of time under the control of the timer 11. Measurement sampling M3 shown in FIG. 5 shows the timing with which the measurement is preformed by the comparator circuit 14 at the predetermined intervals of time. Since the state of charge of the battery 5 is low, the battery voltage Vbt of the battery 5 rises nearly to the no-load voltage Vbt1 over a considerable length of time after the end of the fast forward driving operation. Accordingly, only after the measurement sampling M3 has been repeated a considerable number times, does the battery voltage Vbt of the battery 5 exceed the reference voltage V3 by reference to which the battery recovery state is judged.

After the measurement sampling M3 has been repeated many times at predetermined intervals of time, when the battery voltage Vbt exceeds the reference voltage V3 (as indicated by arrow A3) the battery recovery signal P4 is output from the comparator circuit 14. When the battery recovery signal P4 is received, the control circuit 20 determines that the battery 5 has recovered, and instructs the battery state detection circuit 10 to stop the measurement. Then, the control circuit 20 outputs the motor control signal P5 as a drive instruction for the next fast forward driving operation, and resumes the fast forward driving of the motor 31 (next timing T7). Thereafter, the timings T7, T8, T7, T8, etc. are repeated in sequence, as long as the fast forward driving of the motor 31 continues.

In this way, when the state of charge of the battery 5 is low, the measurement sampling M3 is repeated many times until the battery 5 recovers and, when the battery 5 has recovered, the recovery of the battery 5 can be quickly detected. As a result, while the repeating cycle of the fast forward driving (the period from one timing T7 to the next timing T7) becomes longer than that when the battery 5 is in a medium state of charge condition shown in FIG. 4, the fast forward driving can be repeatedly performed in the shortest possible time in accordance with the recovery state of the battery 5.

As previously described in connection with step ST9 in the flowchart of FIG. 2, the measuring operation of the battery state detection circuit 10 is terminated by determining whether the measurement has been performed a predetermined number of times (or when a predetermined elapsed time has elapsed). Accordingly, if the battery 5 does not recover even after the predetermined condition is reached, the fast forward driving is stopped, and the electronic watch 1 moves to the battery recovery mode.

As described above, in the electronic apparatus according to the present invention, the battery voltage is measured at predetermined intervals of time after stopping the driving of the load and, when it is determined that the battery has recovered sufficiently to be able to drive the load, the next cycle of load driving is immediately executed. In this way, since the electronic apparatus according to the present invention can advance the load driving timing in accordance with the recovery state of the battery, high-speed driving of the load can be achieved in accordance with the recovery state of the battery. In particular, in an electronic watch equipped with a secondary battery that is charged by a solar battery or the like, as in the present embodiment, it is often the case that the secondary battery is used in a nearly fully charged condition. Accordingly, the present invention can be applied with great advantage to an electronic watch equipped with a solar battery, because significant speedup of the fast forward driving of the motor can then be achieved.

Further, in the electronic apparatus according to the present invention, when the driving capability of the battery is low because of low battery level or low ambient temperature, or when the battery is small and its capacity as a power supply is limited, since the load is driven in accordance with the battery capacity after waiting until the battery recovers, optimum load driving that does not cause an overloaded condition can be achieved for various driving conditions. Furthermore, when the battery is unable to recover sufficiently to be able to drive the load, the electronic apparatus according to the present invention moves to the power supply recovery mode to allow the battery to be recharged or switches to a light load driving mode to prevent overdischarging of the battery, thus ensuring high reliability.

Figure 6:
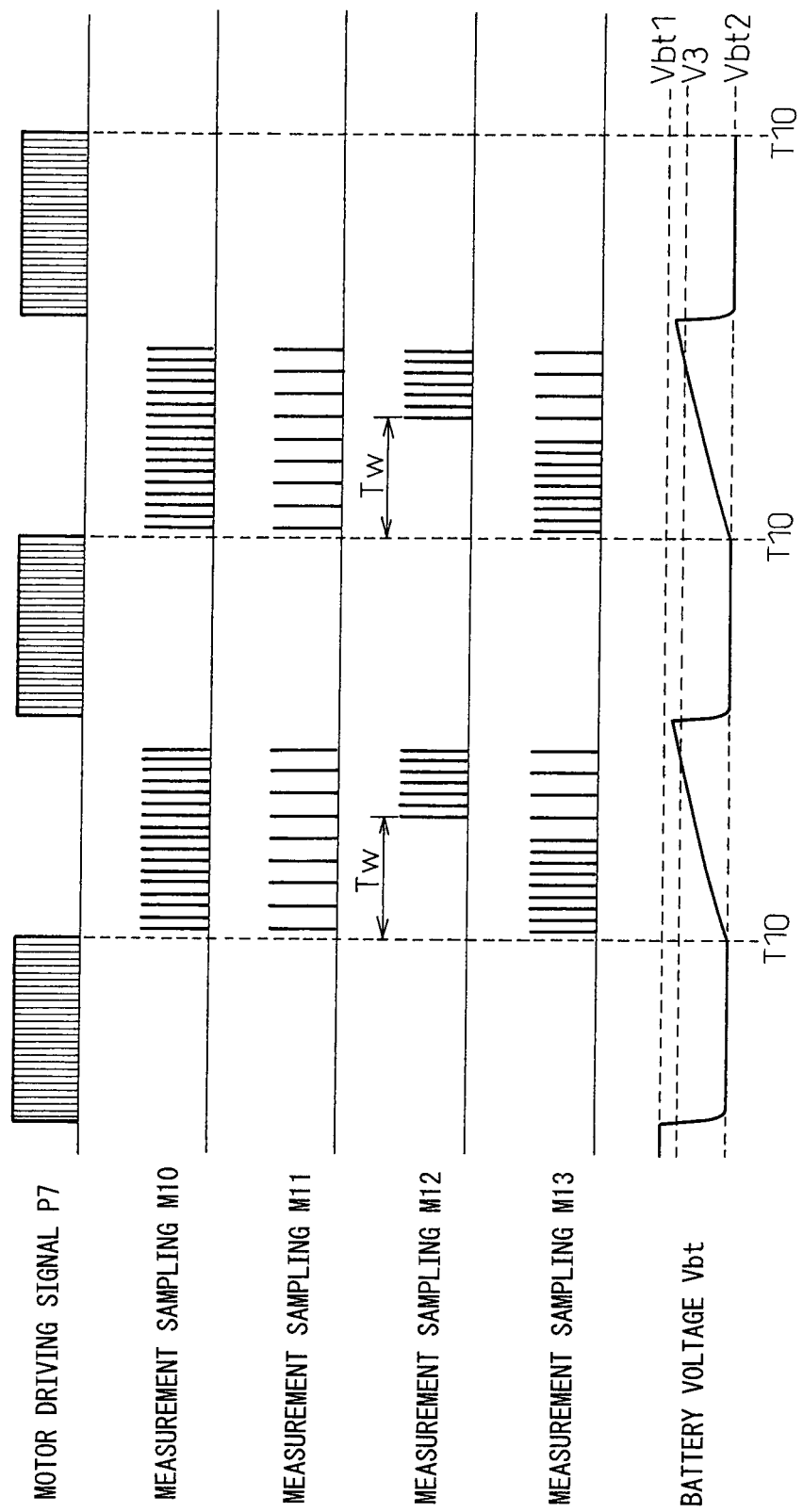
FIG. 6 is a timing chart explaining the effect of varying the time intervals at which the battery voltage of the electronic watch is measured.

FIG. 6 is a timing chart for explaining the effect of varying the time intervals at which the battery voltage of the electronic watch is measured.

In the first embodiment, when the fast forward driving of the motor 31 ends, the battery state detection circuit 10 starts to measure the battery voltage Vbt. However, the measurement of the battery voltage Vbt can be performed in various ways, some examples of which will be described below with reference to FIG. 6.

In FIG. 6, measurement sampling M10 is an example in which the battery voltage Vbt is measured at relatively short time intervals (for examples, at intervals of 25 mS) immediately following the end (timing T10) of the fast forward driving of the motor 31. The measurement sampling M10 is similar in timing to the measurement sampling M1 shown in FIG. 3, the measurement sampling M2 shown in FIG. 4, and the measurement sampling M3 shown in FIG. 5. Further, since the measurement time interval is relatively short, the measurement sampling M10 is suitable for detecting the recovery of a battery that is in a fully charged condition or in a medium state of charge condition.

Measurement sampling M11 is an example in which the battery voltage Vbt is measured at relatively long time intervals (for examples, at intervals of 50 mS) immediately following the end (timing T10) of the fast forward driving of the motor 31. Since the measurement time interval is relatively long, the measurement sampling M11 is suitable for detecting the recovery of a battery that takes time to recover because of low state of charge or a battery whose capacity is small.

Measurement sampling M12 is an example in which the measurement of the battery voltage Vbt is started after waiting for a predetermined time (Tw) to elapse from the end (timing T10) of the fast forward driving of the motor 31. Since the measurement is started after a predetermined time has elapsed from the end of the fast forward driving, the measurement sampling M12 is suitable for detecting the recovery of a battery that takes time to recover because of low state of charge or a battery whose capacity is small.

Measurement sampling M13 is an example in which the battery voltage Vbt is measured first at relatively short time intervals (for examples, at intervals of 25 mS) immediately following the end (timing T10) of the fast forward driving of the motor 31 and then, after a predetermined time has elapsed, at relatively long time intervals (for examples, at intervals of 50 mS) toward the end of the measurement period. Since the measurement time interval differs between the first half and second half of the measurement period, the measurement sampling M13 is a sampling scheme that can address various situations regardless of whether the battery is in a fully charged condition and can therefore recover quickly or in a low state of charge condition and therefore takes time to recover, whether the capacity of the battery is small, or whether the battery is operated at normal temperatures or at low temperatures.

Any of the measurement sampling schemes M11 to M13 described above for the measurement of the battery voltage Vbt can be used in the electronic watch 1 described with reference to FIGS. 1 to 5. As described above, the measurement sampling can be implemented in various ways, but in any measurement sampling, it is important that, after stopping the driving of the load, the battery voltage be measured in succession at intervals of time shorter than the recovery time of the battery.

Further, the measurement sampling scheme can be dynamically selected according to the state of charge of the battery, the ambient temperature, the differences in battery capacity due to the size and characteristics of the battery, etc., in such a manner that when the battery 5 is in a state that can quickly recover, the measurement sampling M10 is selected thereby detecting the recovery of the battery quickly and, when the battery 5 is in a state that takes time to recover, the measurement sampling M11 or M12 is selected thereby reducing the loss of the measurement operation. By changing the measurement sampling in this way, not only can optimum load driving that matches the state of the battery be achieved, but the battery life of the electronic apparatus can be extended by reducing wastage of power consumption due to needless measurement operations.

Figure 7:
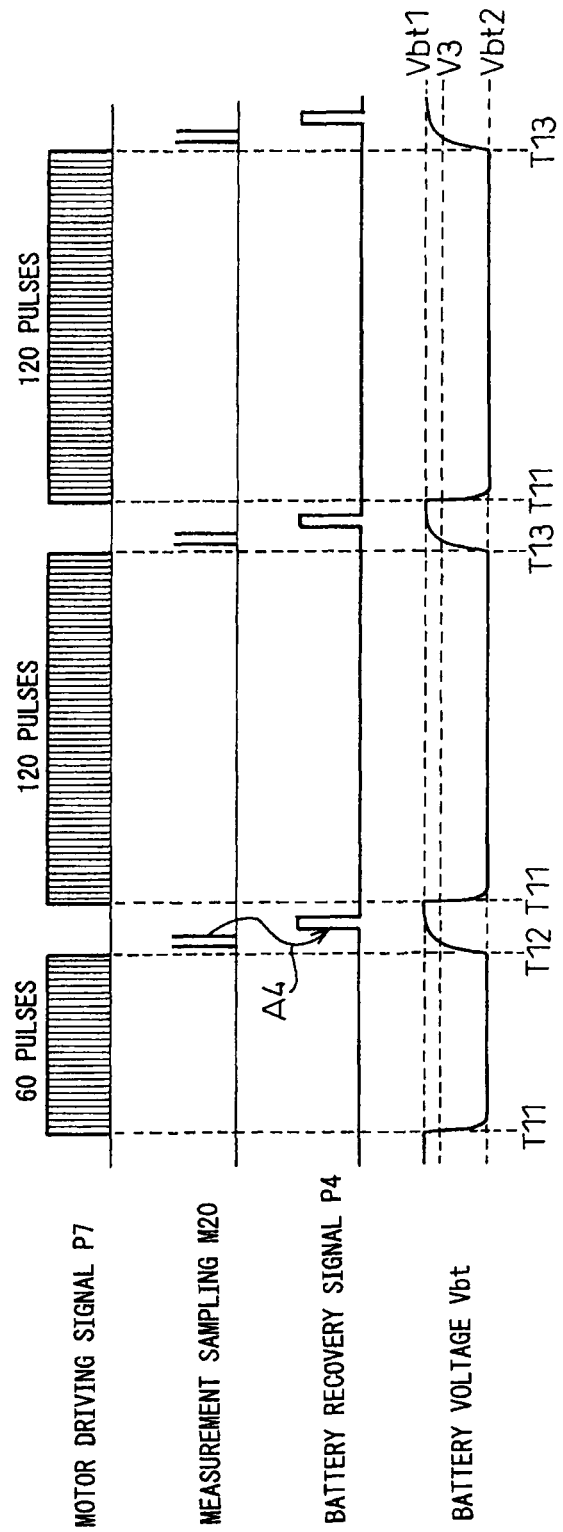
FIG. 7 is a timing chart explaining the effect of varying the detection frequency of the battery voltage in the electronic watch.

FIG. 7 is a timing chart for explaining the effect of varying the detection frequency of the battery voltage in the electronic watch.

The operation for varying the detection frequency of the battery voltage will be described with reference to FIG. 7. In FIG. 7, it is assumed that the battery 5 in the electronic watch 1 is in a nearly fully charged condition and that the ambient temperature is in a normal temperature range, the battery thus being in a state that can recover quickly.

First, suppose that the electronic watch 1 is set to the time adjusting mode and the fast forward driving of the motor is started (timing T11). As earlier described, one fast forward driving operation of the motor is performed by outputting 60 pulses of the motor driving signal P7 and thereby causing the second hand to make one revolution. This fast forward driving operation consumes high power from the battery 5. Accordingly, during the period from the start (timing T11) of the fast forward driving to the end (timing T12) of one fast forward driving operation, the battery voltage Vbt drops to the voltage Vbt2 as shown in the figure.

Next, when the one fast forward driving operation ends (timing T12), the battery state detection circuit 10 starts to measure the battery voltage Vbt, and the measurement by the comparator circuit 14 is preformed at predetermined intervals of time under the control of the timer 11. Measurement sampling M20 shows the timing with which the comparator circuit 14 operates. In this case, since the battery 5 is in a nearly fully charged condition and can therefore recover quickly, the battery voltage Vbt of the battery 5 quickly rises to the no-load voltage Vbt1 after the end of the fast forward driving operation. By the second timing of the measurement sampling M20, the battery voltage Vbt of the battery 5 has risen to a level higher than the reference voltage V3 by reference to which the battery recovery state is judged.

The battery recovery signal P4 is output from the comparator circuit 14 in synchronism with the second timing of the measurement sampling M20 (as indicated by arrow A4). When the battery recovery signal P4 is received, the control circuit 20 determines that the battery 5 has recovered, and instructs the battery state detection circuit 10 to stop the measurement, and the fast forward driving of the motor 31 is resumed (next timing T11). At this point, the control circuit 20 realizes that the battery recovery signal P4 is output at the second timing of the measurement sampling M20. Accordingly, the control circuit 20 determines that the battery 5 is in a state that can recover quickly, and performs the next fast forward driving operation by setting the number of output pulses of the motor driving signal P7, for example, to twice the usual number, i.e., to 120, thereby causing the second hand to make two revolutions.

It therefore follows that the next measurement sampling M20 is performed after the end (timing T13) of the second fast forward driving operation, that is, after the end of the 120th pulse of the motor driving signal P7. However, since the battery 5 is in a nearly fully charged condition, and the ambient temperature is within the normal temperature range, there will be no problem in the operation of the watch if the number of times that the recovery state of the battery 5 is detected (the detection frequency) is reduced to increase the amount of fast forward driving. In other words, when the battery 5 is in a state that can recover quickly, the detection frequency of the battery voltage Vbt can be reduced to increase the amount of fast forward driving; i.e., by reducing the time loss that may occur when detecting the recovery state of the battery 5, speedup of the fast forward driving of the motor 31 can be achieved.

Furthermore, since the detection frequency of the battery voltage Vbt decreases, the power consumption associated with the measurement operation can be reduced, which serves to extend the battery life of the electronic apparatus. If the quick recovery state of the battery 5 can be maintained, the extended fast forward driving operation may be performed repeatedly as shown in the figure. On the other hand, when the capacity of the battery 5 becomes low, or when the driving capability of the battery 5 has dropped due to low ambient temperature, and the recovery of the battery 5 becomes slow, the number of output pulses of the motor driving signal P7 per fast forward driving operation may be reduced from the usual 60 pulses to, for example, 30 pulses, contrary to the control shown in FIG. 7.

In this case, since the recovery state of the battery 5 can be detected more frequently by increasing the detection frequency of the battery voltage Vbt for the amount of load driving, if the driving capability of the battery 5 drops due to reduced capacity of the battery 5, etc., highly reliable load driving can be achieved. The number of output pulses of the motor driving signal P7 per fast forward driving operation is not limited to the above specific numbers, but can be determined as desired in accordance with the specification of the electronic watch.

Figure 8:
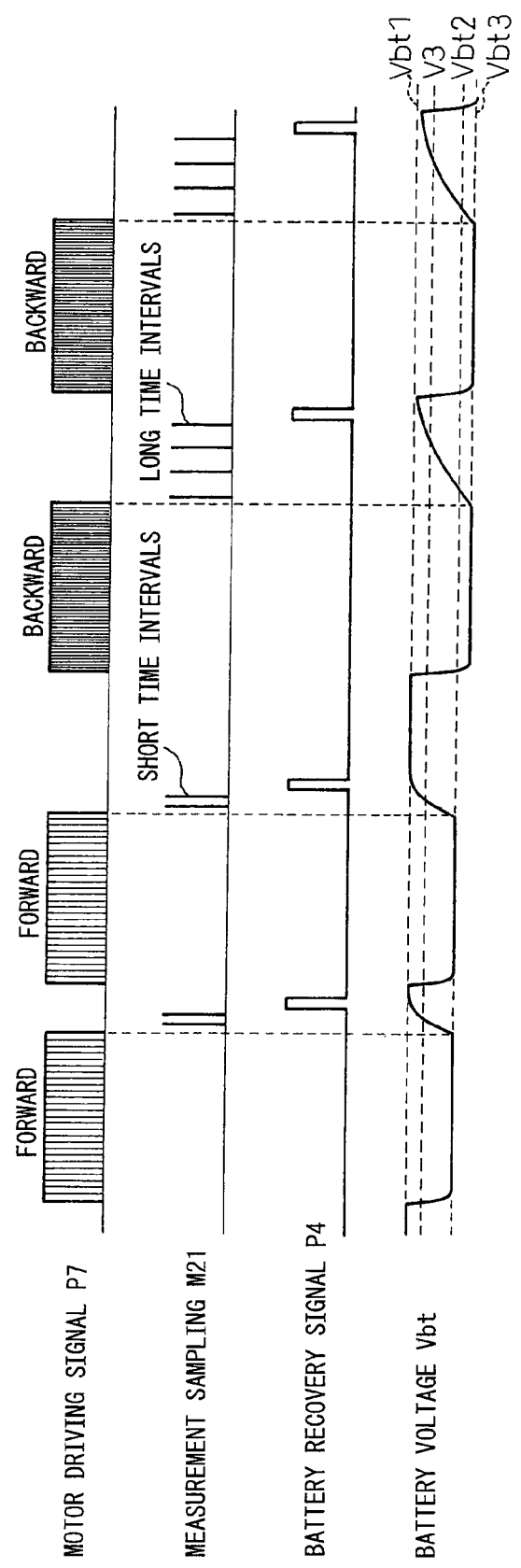
FIG. 8 is a timing chart explaining the effect of varying the time intervals of the battery voltage measurement according to different load driving conditions of the electronic watch.

FIG. 8 is a timing chart explaining the effect of varying the time intervals of the battery voltage measurement according to different load driving conditions of the electronic watch.

The control for varying the detection condition of the battery voltage measurement according to different load driving conditions of the electronic watch will be described with reference to FIG. 8. Usually, the motor used in the electronic watch can be driven in both forward and backward directions, but it is known that the backward driving, which requires supplying complex drive pulses to the motor 31, consumes power three times that required for the forward driving. In this way, for the same load (motor), the power consumption varies according to different driving conditions, and thus the load for the battery may vary.

FIG. 8 shows the operation for setting the time intervals of the measurement sampling differently when driving the motor 31 backward than when driving it forward. As shown in FIG. 8, when driving the motor forward, since the load is relatively light, the drop in battery voltage Vbt due to the forward driving is small, and the battery voltage Vbt drops to the voltage Vbt2. On the other hand, when driving the motor backward, since the load is heavy, the drop in battery voltage Vbt due to the backward driving is large, and the battery voltage Vbt drops to the voltage Vbt3.

The control circuit 20 addresses the quick recovery of the battery 5 by setting shorter the time intervals of the measurement sampling M21 performed to measure the battery voltage Vbt after the forward driving. It also addresses the slow recovery of the battery 5 by setting longer the time intervals of the measurement sampling M21 performed to measure the battery voltage Vbt after the backward driving. In this way, when the time intervals of the measurement sampling M21 performed to measure the battery voltage Vbt are varied according to different load driving conditions, not only can the speedup of the load driving be achieved by properly detecting the recovery of the battery 5, but wastage of power consumption due to needless measurement operations can be reduced by reducing the loss of the measurement operation.

FIG. 8 has shown the case where the time intervals at which to measure the battery voltage Vbt are varied according to different driving conditions of the motor 31 as the load, but the voltage detection condition to be varied is not limited to the above one. For example, the detection conditions for the battery voltage Vbt, such as the measurement time intervals, the value of the reference voltage V3, the number of times of the measurement to be made, the elapsed time, etc., can be varied differently according to different load driving conditions, to achieve load driving and battery state detection that properly address the differences in the load driving conditions.

Further, the differences in the load driving conditions are not limited to the above-described differences associated with the forward/backward driving of the motor 31. For example, in the forward driving of the motor, the driving conditions are different when driving the motor to move the hand fast forward than when driving the motor to move the hand by one second in normal operation. By varying the detection conditions for the battery voltage Vbt, such as the measurement time intervals, the value of the reference voltage V3, the number of times of the measurement to be made, the elapsed time, etc., differently according to such differences in the load driving conditions, proper load driving and proper battery state detection can be achieved.

It should also be noted that the battery voltage Vbt of the battery 5 varies depending on the state of charge of the battery, ambient temperature, etc. In the electronic watch, it is usual to perform control for stable motor driving by varying the drive pulse shape of the motor driving signal P7 in accordance with the change of the battery voltage Vbt. When the drive pulse shape is varied in accordance with the change of the battery voltage Vbt, the load for the battery 5 also varies. Accordingly, if the detection conditions for the battery voltage Vbt are also varied in accordance with the change of the drive pulse shape, the reliability of the load driving can be further enhanced.

As described above, in the electronic apparatus according to the present invention, since the load is driven by quickly detecting the recovery state of the battery after stopping the driving of the load, as shown in the first embodiment, high-speed driving of the load that matches the state of charge of the battery can be achieved. Furthermore, in the electronic apparatus according to the present invention, since the battery voltage detection conditions, such as the measurement time intervals, the value of the reference voltage V3, the number of times of the measurement to be made, the elapsed time, etc., can be properly varied in accordance with the recovery state of the battery, the load driving conditions, etc., stable load driving can be accomplished even when driving the load by a small-capacity battery.

Figure 9:
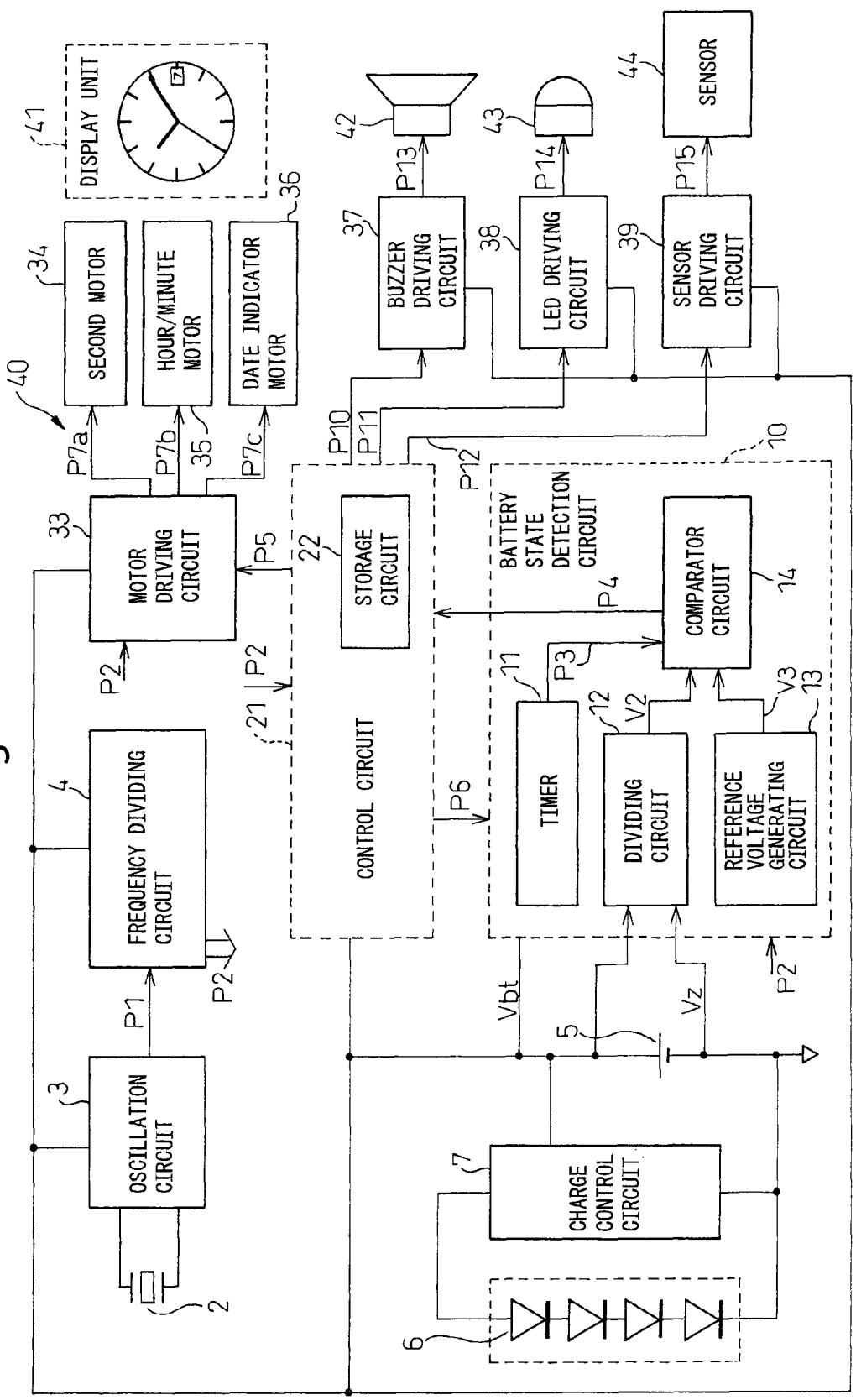
FIG. 9 is a diagram schematically showing the configuration of a multi-function electronic watch as an electronic apparatus according to the present invention.

FIG. 9 is a diagram schematically showing the configuration of a multi-function electronic watch as an electronic apparatus according to a second embodiment of the present invention.

The feature of the multi-function electronic watch 40 shown in FIG. 9 is that the electronic watch is constructed to drive the display unit by three motors and includes a buzzer, an illumination device, a sensor, etc. The same component elements as those shown in the block diagram of the first embodiment are designated by the same reference numerals, and the configuration and operation of such component elements will not be discussed in detail herein.

In FIG. 9, the quartz crystal 2, the oscillation circuit 3, the frequency dividing circuit 4, the battery 5, the solar battery 6, the charge control circuit 7, and the battery state detection circuit 10 are the same as those in the electronic watch 1 shown in FIG. 1, and the description thereof will not be repeated here. A control circuit 21 as a control means is similar in function to the corresponding circuit in the electronic watch 1, but differs by the inclusion of a storage circuit 22 as a storage means. The control circuit 21 further outputs a buzzer control signal P10, an LED control signal P11, and a sensor control signal P12.

The storage circuit 22 is constructed from a RAM or a nonvolatile memory or the like, and stores the detection conditions such as the time intervals at which the battery state detection circuit 10 measures the battery voltage Vbt. It is advantageous to construct the storage circuit 22 from a RAM because of its low power consumption, but in that case, it is preferable to perform control so that, when the battery voltage Vbt drops, the data stored in the RAM storage circuit 22 is saved to a nonvolatile memory (not shown) built into the control circuit 21.

A motor driving circuit 33 as a load driving means outputs motor driving signals P7a, P7b, and P7c based on the timing signal P2 supplied from the frequency dividing circuit 4 and the motor control signal P5 supplied from the control circuit 21. A second motor 34 drives the second hand on the display unit 41 in accordance with the motor driving signal P7a input to it. An hour/minute motor 35 drives the hour/minute hands on the display unit 41 in accordance with the motor driving signal P7b input to it. A date indicator motor 36 drives the date indicator on the display unit 41 in accordance with the motor driving signal P7c input to it.

A buzzer driving circuit 37 as a load driving means takes the buzzer control signal P10 as an input and outputs a buzzer driving signal P13. An LED driving circuit 38 as a load driving means takes the LED control signal P11 as an input and outputs an LED driving signal P14. A sensor driving circuit 39 as a load driving means takes the sensor control signal P12 as an input and outputs a sensor driving signal P15.

The buzzer 42 as a load produces an alarm sound or the like in accordance with the buzzer driving signal P13 input to it. The LED 43 as a load operates in accordance with the LED driving signal P14 input to it, and illuminates the display unit 41 so that the display unit 41 can be viewed in darkness. The sensor 44 as a load measures depth of water, temperature, etc., in accordance with the sensor driving signal P15 input to it.

As shown, the battery voltage Vbt of the battery 5 is supplied to the oscillation circuit 3, the frequency dividing circuit 4, the control circuit 21, the battery state detection circuit 10, the motor driving circuit 33, the buzzer driving circuit 37, the LED driving circuit 38, and the sensor driving circuit 39, and is used to power the respective circuits. The zero voltage Vz of the battery 5 is also connected to the respective circuits, but the connections are not shown here. Preferably, the circuits constituting the multi-function electronic watch 40 are implemented on a single-chip microcomputer, but the implementation of the circuits need not be limited to a single-chip microcomputer.

Next, the operation of the multi-function electronic watch 40 according to the second embodiment will be described. The motor driving circuit 33 drives the respective loads, i.e., the hand motor 34, the hour/minute motor 35, and the date indicator motor 36, in accordance with the motor control signal P5 supplied from the control circuit 21. The motor driving signals P7a to P7c each require supplying a large drive current to the corresponding motor; accordingly, each time any one of the motor driving signals P7a to P7c is output, a large current is supplied from the battery 5, and the battery voltage Vbt of the battery 5 temporarily drops. The battery state detection circuit 10 has the function of judging the recovery state of the battery 5 by detecting the change in the battery voltage Vbt associated with the driving of each motor. Since the basic operation of the battery state detection circuit 10 is the same as that described in the first embodiment, it will not be further described herein.

The buzzer driving circuit 37, the LED driving circuit 38, and the sensor driving circuit 39 drive the buzzer 42, the LED 43, and the sensor 44, respectively, in accordance with the respective control signals supplied from the control circuit 21. When driving any one of the buzzer 42, the LED 43, and the sensor 44, the corresponding drive current is supplied from the battery 5, and the battery voltage Vbt of the battery 5 temporarily drops. The battery state detection circuit 10 has the function of judging the recovery state of the battery 5 by detecting the change in the battery voltage Vbt associated with the driving of the buzzer 42, the LED 43, or the sensor 44, as in the case of the motor driving.

Figure 10:
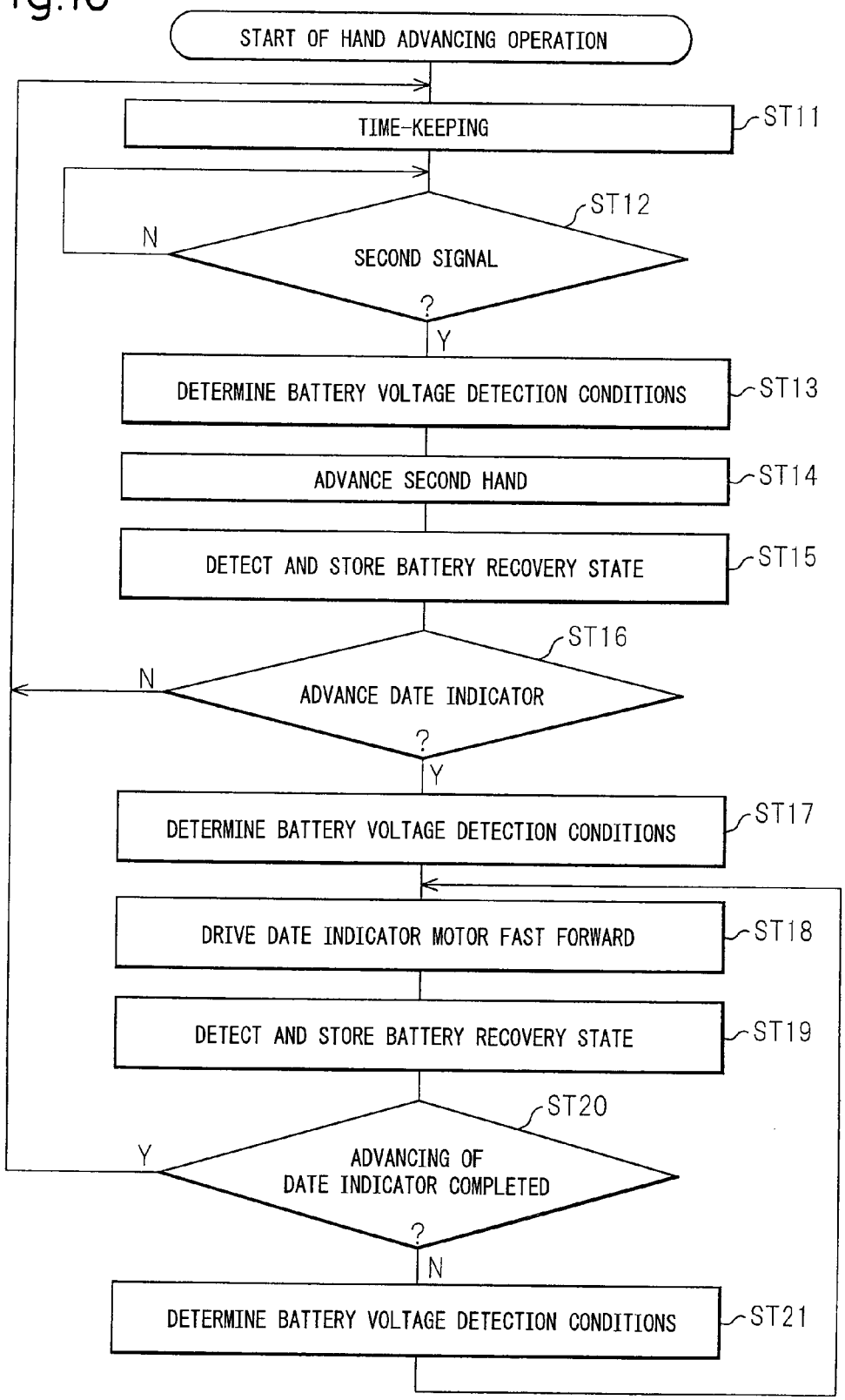
FIG. 10 is a flowchart explaining operation when driving a plurality of loads in the multi-function electronic watch.

FIG. 10 is a flowchart explaining operation when driving a plurality of loads in the multi-function electronic watch.

Referring to the flowchart of FIG. 10, the battery recovery state detection and load driving operation when driving a plurality of loads will be described below by taking as an example the case where the hand motor 34 and the date indicator motor 36 are driven in the multi-function electronic watch 40.

First, suppose that the multi-function electronic watch 40 is operating normally and the frequency dividing circuit 4 is performing time-keeping operation based on the reference clock P1 (step ST11).

Then, when one second has elapsed, the frequency dividing circuit 4 outputs the second signal P2 (step ST12). Here, when one second has not yet elapsed, the process waits in step ST12.

Next, the control circuit 21 retrieves the past detection conditions stored in the storage circuit 22. Then, based on the past detection conditions, the control circuit 21 varies, as needed, the detection conditions for the battery voltage Vbt, such as the time intervals at which to measure the battery voltage Vbt, the measurement start time, the reference voltage V3, the number of times of the measurement or the elapsed time, the detection frequency, etc., and outputs the battery detection control signal P6 (step ST13). When detecting the battery voltage Vbt for the first time, and when no past detection conditions are stored in the storage circuit 22, the control circuit 21 sets prescribed standard detection conditions (initial values).

Then, the control circuit 21 outputs the motor control signal P5, in response to which the motor driving circuit 33 outputs the motor driving signal P7a and drives the second motor 34 to advance the second hand by one second (step ST14).

Next, the battery information detection circuit 10 sets the timer 11 based on the battery detection control signal P6, and outputs the reference voltage V3 from the reference voltage generating circuit 13. Further, in the battery information detection circuit 10, the comparator circuit 14 compares the battery dividing voltage V2 with the reference voltage V3 at predetermined intervals of time, and measures the battery voltage Vbt to detect the recovery state of the battery 5 (step ST15).

When the battery 5 recovers, and the battery recovery signal P4 is output, the control circuit 21 stores in the storage circuit 22 the detection conditions (the time intervals at which to measure the battery voltage Vbt, the measurement start time, the reference voltage V3, the number of times of the measurement made or the time elapsed until the battery recovers, etc.) obtained from the driving of the second motor 34. On the other hand, when the battery 5 does not recover even after the measurement has been made the predetermined number of times, the process moves to the battery recovery mode, as in the flowchart of FIG. 2 shown in the first embodiment; this operation flow is the same as that in the first embodiment, and therefore will not be described in detail herein.

Next, the control circuit 21 checks the internally stored time-keeping information, and determines whether there is a need to advance the date indicator (step ST16). If the date of the time-keeping information has changed, there is a need to advance the date indicator, so that the answer in step ST16 is YES, and the control circuit 21 proceeds to the next step. On the other hand, if the date of the time-keeping information has not changed yet, there is no need to advance the date indicator, so that the answer in step ST16 is NO, and the control circuit 21 returns to step ST11. In other words, the process from step ST11 to step ST16 is repeated as long as the date remains unchanged. The hour/minute motor 35 is driven once in every minute, but the operation is basically the same as that of the second hand 34 and, therefore, will not be described here.

Next, the control circuit 21 retrieves the past detection conditions stored in the storage circuit 22, determines the detection conditions for the battery voltage Vbt, and outputs the battery detection control signal P6 (step ST17). The detection conditions retrieved here from the storage circuit 22 represent the information obtained when the second motor 34 was driven in the immediately preceding period. However, when driving the date indicator motor 36 for the first time, the detection conditions, such as the time intervals at which to measure the battery voltage Vbt, the measurement start time, the reference voltage V3, the prescribed number of times of the measurement or the elapsed time, the detection frequency, etc., are determined by varying the conditions, as needed, based on the detection conditions for the battery voltage Vbt associated with the load driven in the immediately preceding period.

For example, when the detection conditions associated with the second motor 34 driven in the immediately preceding period show that the battery 5 recovered quickly, the control circuit 21 addresses the quick recovery of the battery by setting shorter the time intervals at which the battery voltage Vbt is measured after driving the date indicator motor 36. On the other hand, for example, when the detection conditions associated with the second motor 34 driven in the immediately preceding period show that the battery 5 was slow to recover, the control circuit 21 addresses the slow recovery of the battery by setting longer the time intervals at which the battery voltage Vbt is measured after driving the date indicator motor 36.

Next, the control circuit 21 outputs the motor control signal P5, in response to which the motor driving circuit 33 drives the date indicator motor 36 fast forward (step ST18). Since the date indicator motor 36 cannot advance the date indicator by one day in a single fast forward driving operation (for example, 60 pulses), the fast forward driving of the date indicator motor 36 is performed in a number of steps.

When one fast forward driving operation of the date indicator motor 36 ends, the battery state detection circuit 10 sets the timer 11 based on the battery detection control signal P6, and outputs the reference voltage V3 from the reference voltage generating circuit 13. Further, in the battery state detection circuit 10, the comparator circuit 14 compares the battery dividing voltage V2 with the reference voltage V3 at predetermined intervals of time, and measures the battery voltage Vbt to detect the recovery state of the battery 5 (step ST19).

Here, when the battery 5 recovers, and the battery recovery signal P4 is output, the control circuit 21 newly stores in the storage circuit 22 the detection conditions (the time intervals at which to measure the battery voltage Vbt, the measurement start time, the reference voltage V3, the number of times of the measurement made or the time elapsed until the battery recovers, etc.) obtained from the fast forward driving of the date indicator motor 36. On the other hand, when the battery 5 does not recover even after the measurement has been made the predetermined number of times, the process moves to the battery recovery mode, as in the first embodiment; this operation flow is the same as that in the first embodiment and, therefore, will not be described in detail herein.

Next, the control circuit 21 determines whether the advancing of the date indicator by the date indicator motor 36 is completed or not (step ST20). If the answer is NO (the advancing of the date indicator is not completed yet), the process proceeds to the next step; on the other hand, if the answer is YES (the advancing of the date indicator is completed), the process returns to step ST11 to continue the usual one-second advancing operation.

Next, if the answer in step ST20 is NO, the control circuit 21 retrieves the past detection conditions stored in the storage circuit 22, determines the detection conditions for the battery voltage Vbt, and outputs the battery detection control signal P6 (step ST21). Since the past detection conditions retrieved here from the storage circuit 22 represent the information obtained when the date indicator motor 36 was driven fast forward in the immediately preceding period, the load and driving conditions are the same, and the detection conditions for the battery voltage Vbt can be determined based on the immediately preceding battery recovery information. In this way, the electronic apparatus according to the present invention can accomplish proper load driving and battery state detection.

As described above, in the electronic apparatus according to the present invention, even when there are a plurality of loads providing different loads and having different load driving conditions, proper load driving that matches the recovery state of the battery can be performed. This is because, when driving the different loads in succession, the drive instruction and the detection conditions for the battery voltage Vbt for the next load to be driven are determined based on the detection conditions associated with the load driven in the immediately preceding period. Accordingly, the electronic apparatus according to the present invention can achieve not only high-speed driving of a plurality of loads but also highly reliable load driving using a small-capacity battery.

Figure 11:
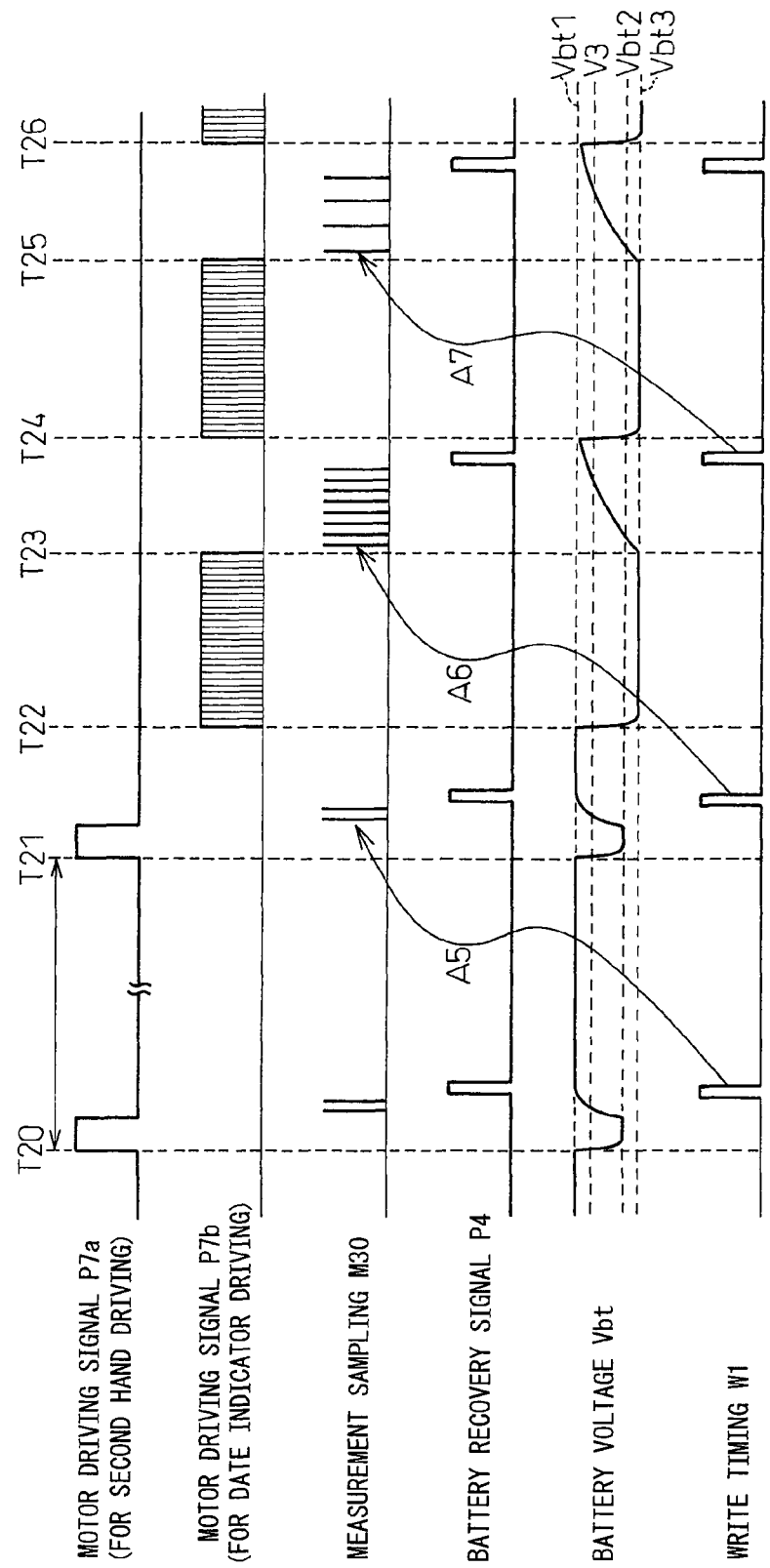
FIG. 11 is a timing chart explaining the operation for driving the plurality of loads in the multi-function electronic watch.

FIG. 11 is a timing chart for explaining the operation for driving the plurality of loads in the multi-function electronic watch.

Next, one example of the operation for driving the second motor 34 and the date indicator motor 36 will be described with reference to the timing chart of FIG. 11. As shown in FIG. 11, the motor driving signal P7a is output at intervals of one second, as shown by timings T20 and T21, to advance the second hand by one second. When the motor driving signal P7a is output, the battery voltage Vbt of the battery 5 drops from the no-load voltage Vbt1 to the load voltage Vbt2.

After driving the second motor 34, the control circuit 21 retrieves the past detection conditions from the storage circuit 22, and determines the detection conditions for the battery voltage Vbt. The battery information detection circuit 10 measures the battery voltage Vbt at predetermined intervals of time (measurement sampling M30). When the recovery of the battery 5 is detected with the battery voltage Vbt exceeding the reference voltage V3, the battery information detection circuit 10 outputs the battery recovery signal P4 to the control circuit 21. In response to the battery recovery signal P4, the control circuit 21 stores the detection conditions (the time intervals at which to measure the battery voltage Vbt, the measurement start time, the reference voltage V3, the number of times of the measurement made or the time elapsed until the battery recovers, etc.) newly obtained from the driving of the second motor 34 into the storage circuit 22 by write timing W1.

In the measurement sampling M30 after the first driving of the second hand 34 at timing T20, the battery voltage Vbt is measured using the prescribed standard detection conditions (initial values). However, in the measurement sampling M30 after the driving of the second hand 34 at timing T21, the detection conditions are determined based on the detection information of the battery voltage Vbt stored after the driving performed at timing T20 one second before (as indicated by arrow A5).

Next, the motor driving signal P7c is output at timing T22 to drive the date indicator motor 36 fast forward, and the driving stops at timing T23. When the motor driving signal P7c is output, the battery voltage Vbt of the battery 5 drops from the no-load voltage Vbt1 to the load voltage Vbt3. Since the date indicator motor 36 requires larger drive power than the second motor 34, larger power is consumed from the battery 5. As a result, the amount of drop in the battery voltage Vbt is larger, and the battery 5 becomes correspondingly slower to recover.

After stopping the fast forward driving of the date indicator motor 36, the control circuit 21 retrieves the past detection conditions from the storage circuit 22, and determines the detection conditions for the battery voltage Vbt. The battery information detection circuit 10 starts to measure the battery voltage Vbt at predetermined intervals of time immediately after timing T23. When the recovery of the battery 5 is detected with the battery voltage Vbt exceeding the reference voltage V3, the battery information detection circuit 10 outputs the battery recovery signal P4 to the control circuit 21. In response to the battery recovery signal P4, the control circuit 21 stores the detection conditions newly obtained from the driving of the date indicator motor 36 into the storage circuit 22 by write timing W1.

The fast forward driving of the date indicator motor 36 is performed repeatedly a number of times, as earlier described.

As shown in the figure, the fast forward driving is started at timings T22, T24, T26, etc. and is stopped at timings T23, T25, etc.

In the measurement sampling M30 after stopping the first fast forward driving of the date indicator motor 36 (timing T23), the detection conditions are determined based on the detection information of the battery voltage Vbt stored after the driving of the second motor 34 performed at timing T21 in the immediately preceding period (as indicated by arrow A6).

Since the load characteristics and driving conditions are different between the hand motor 34 and the date indicator motor 36, the past detection conditions stored in relation to the driving of the hand motor 34 do not perfectly match the driving of the date indicator motor 36. However, since the detection information stored after the driving of the second motor 34 at timing T21 represents the recovery information of the battery 5 immediately before driving the date indicator motor 36, the information can provide sufficient information as to the state of charge of the battery 5, the ambient temperature, etc. Therefore, the instruction for driving the date indicator motor 36 and the detection conditions for the battery voltage Vbt after the driving can be determined based on the detection conditions for the battery 5 obtained from the driving of the second motor 34, and this has a great effect in achieving highly reliable load driving.

In the measurement sampling M30 after the end (timing T25) of the second fast forward driving of the date indicator motor 36, the detection conditions are newly determined (as indicated by arrow A7) based on the past detection conditions stored in the storage circuit 22 after the driving of the date indicator motor 36 in the immediately preceding period (timing T23). That is, for the second and subsequent fast forward driving of the date indicator motor 36, the drive instruction and the detection conditions for the battery voltage Vbt are determined based on the immediately preceding fast forward driving of the date indicator motor 36. Since the detection conditions here are determined based on the detection conditions previously obtained for the same load under the same driving conditions, and since the detection conditions can be dynamically varied based on the recovery information including the state of charge of the battery 5, the ambient temperature, etc. in the immediately preceding period, optimum load driving and battery state detection can be achieved.

For example, as a result of the first fast forward driving of the date indicator motor 36 (from timing T22 to timing T23), if it is determined that the battery 5 is slow to recover, the time intervals of the measurement after the second fast forward driving (from timing T24 to timing T25) can be set longer. In this way, by reducing the loss of the measurement operation and thus reducing wastage of power consumption, flexible load driving and battery state detection can be achieved. If the battery becomes even slower to recover, the detection frequency can be increased by reducing the amount of fast forward driving of the date indicator motor 36 per operation. With this arrangement, the recovery state of the battery can be detected meticulously, and highly reliable battery state detection that matches the recovery state of the battery can be achieved.

As described above, in the electronic apparatus according to the second embodiment of the present invention, the detection conditions obtained from the measurements performed by the power supply state detection circuit 10 are stored in the storage means and, based on the stored detection conditions, the detection conditions can be properly adjusted for the driving of the different kinds of loads that have different driving conditions. Accordingly, the present invention can be applied advantageously to a portable electronic apparatus that is small in size, and therefore imposes constraints on the power supply design, and in particular, to a multi-function electronic apparatus that is equipped with a plurality of loads.

Figure 12:
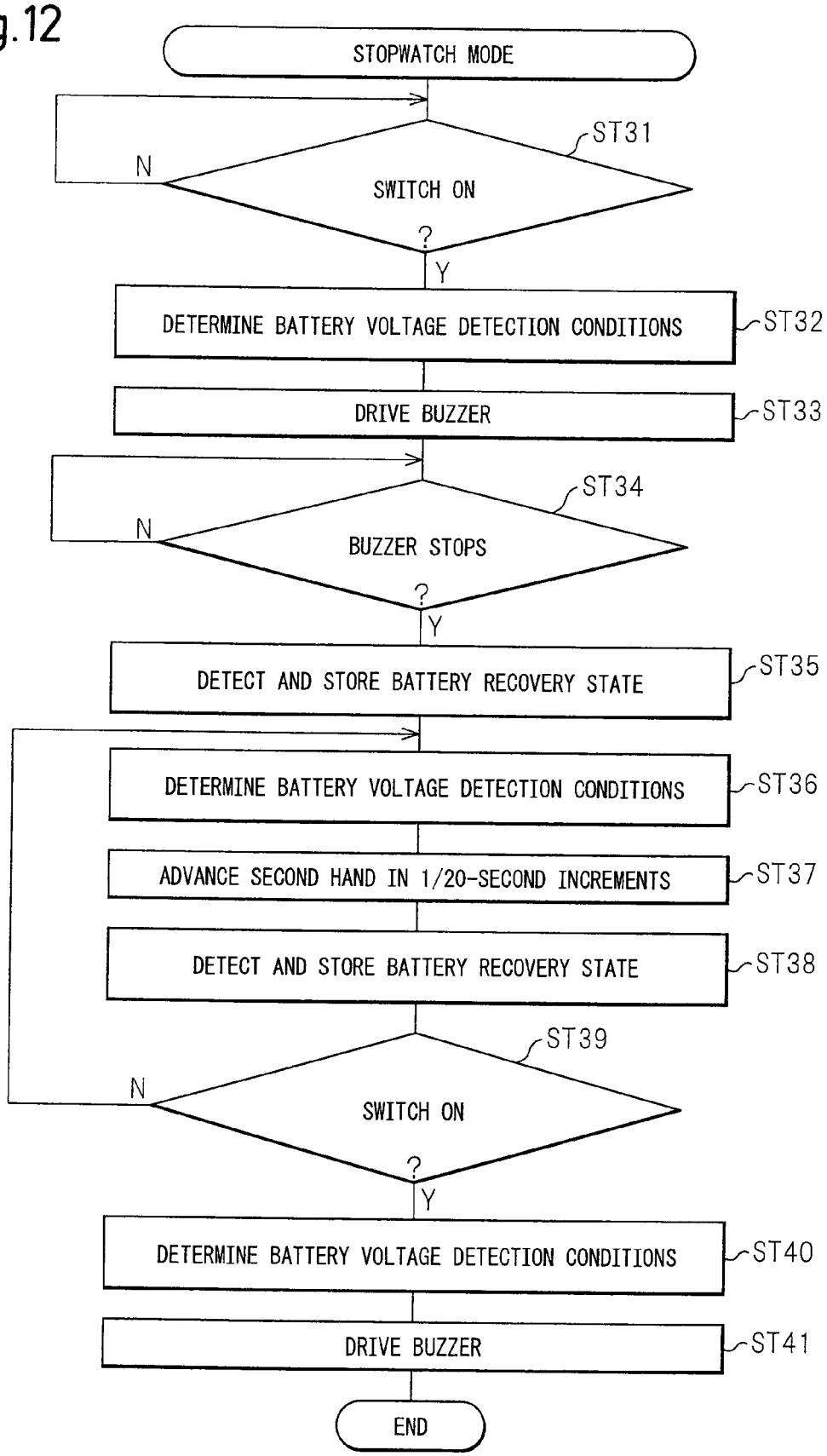
FIG. 12 is a flowchart explaining the driving operation when the plurality of loads to be driven in the multi-function electronic watch have different characteristics.

FIG. 12 is a flowchart explaining the driving operation when the plurality of loads to be driven in the multi-function electronic watch have different characteristics.

Referring to the flowchart of FIG. 12, the load driving operation will be described by taking as an example the operation in the stopwatch mode for the case where two entirely different loads, the buzzer and the motor, are driven in succession. The following description is given by assuming that, in the multi-function electronic watch 40 shown in FIG. 9, the date indicator motor 36 is replaced by a $\frac{1}{20}$-second stepping motor 36a (not shown) which is driven by the motor driving signal P7c to advance the second hand by $\frac{1}{20}$-second increments.

First, in the stopwatch mode, the control circuit 21 in the multi-function electronic watch 40 determines whether the start switch not shown is depressed or not (step ST31). If the answer is NO, the process remains in the standby state, but if the answer is YES (switch ON), the process proceeds to the next step.

Next, if the answer in step ST31 is YES (switch ON), the control circuit 21 retrieves the past detection conditions stored in the storage circuit 22, newly determines the detection conditions for the battery voltage Vbt, and outputs the battery detection control signal P6 (step ST32). When detecting the battery voltage Vbt for the first time, and when no past detection conditions are stored in the storage circuit 22, the control circuit 21 sets prescribed standard detection conditions (initial values).

Next, the control circuit 21 outputs the buzzer control signal P10, in response to which the buzzer driving circuit 37 drives the buzzer 42 to produce a prescribed buzzer sound (step ST33). The reason for producing the buzzer sound here is to notify the user that the time counting in the stopwatch mode is started in response to the depression of the start switch by the user.

Next, the control unit 21 determines whether the buzzer 42 stops sounding (step ST34). If the buzzer 42 is still sounding, the process remains in the standby state, and when the buzzer 42 stops, the process proceeds to the next step.

Next, the battery information detection circuit 10 sets the timer 11 based on the battery detection control signal P6, and outputs the reference voltage V3 from the reference voltage generating circuit 13. Further, in the battery information detection circuit 10, the comparator circuit 14 compares the battery dividing voltage V2 with the reference voltage V3 at predetermined intervals of time, and measures the battery voltage Vbt to detect the recovery state of the battery 5 (step ST35).

When the battery 5 recovers, and the battery recovery signal P4 is output, the control circuit 21 stores in the storage circuit 22 the detection conditions (the time intervals at which to measure the battery voltage Vbt, the measurement start time, the reference voltage V3, the number of times of the measurement made or the time elapsed until the battery recovers, etc.) newly obtained from the driving of the buzzer 42. On the other hand, when the battery 5 does not recover even after the measurement has been made the predetermined number of times, the process moves to the battery recovery mode, as in the first embodiment. This operation flow is the same as that in the first embodiment, and therefore will not be described in detail herein.

Next, as the stopwatch is started, the control circuit 21, in preparation for driving the $\frac{1}{20}$-second stepping motor 36a, retrieves the past detection conditions stored in the storage circuit 22, newly determines the detection conditions for the battery voltage Vbt, and outputs the battery detection control signal P6 (step ST36). The detection conditions retrieved here from the storage circuit 22 represent the information obtained when the buzzer 42 was driven in the immediately preceding period. However, when driving the $\frac{1}{20}$-second stepping motor 36a for the first time, the drive instruction for the $\frac{1}{20}$-second stepping motor 36a and the detection conditions for the battery voltage Vbt are determined based on the detection conditions associated with the buzzer 42 driven in the immediately preceding period.

Next, the control circuit 21 outputs the motor control signal P5, in response to which the motor driving circuit 33 drives the $\frac{1}{20}$-second stepping motor 36a thus starting to advance the second hand in $\frac{1}{20}$-second increments (step ST37). The stopwatch thus starts counting the time with the second hand moving in 50-mS increments.

The control circuit 21 causes the $\frac{1}{20}$-second stepping operation of the $\frac{1}{20}$-second stepping motor 36a to stop at predetermined intervals of time. After the driving of the $\frac{1}{20}$-second stepping motor 36a is stopped, the battery information detection circuit 10 sets the timer 11 based on the battery detection control signal P6, and outputs the reference voltage V3 from the reference voltage generating circuit 13. Further, in the battery information detection circuit 10, the comparator circuit 14 compares the battery dividing voltage V2 with the reference voltage V3 at predetermined intervals of time, and measures the battery voltage Vbt to detect the recovery state of the battery (step ST38).

When the battery 5 recovers, and the battery recovery signal P4 is output, the control circuit 21 stores in the storage circuit 22 the detection conditions newly obtained from the driving of the $\frac{1}{20}$-second stepping motor 36a. On the other hand, when the battery 5 does not recover even after the measurement has been made the predetermined number of times, the process moves to the battery recovery mode, as in the first embodiment. This operation flow is the same as that in the first embodiment, and therefore will not be described in detail herein.

Next, the control circuit 21 determines whether the start switch not shown is depressed or not (step ST39). If the answer is NO (switch OFF), the process returns to step ST36, and the process from step ST36 to step ST39 is repeated, thus continuing the $\frac{1}{20}$-second stepping operation. On the other hand, if the answer is YES (switch ON), the process proceeds to the next step.

Next, if the answer in step ST39 is YES (switch ON), the control circuit 21, in preparation for driving the buzzer 42, retrieves the past detection conditions stored in the storage circuit 22, newly determines the detection conditions for the battery voltage Vbt, and outputs the battery detection control signal P6 (step ST40). The detection conditions retrieved here from the storage circuit 22 represent the information obtained when the hand motor 34 was driven in the immediately preceding period. The instruction for driving the buzzer 42 and the detection conditions for the battery voltage Vbt after the driving are determined based on this information.

Next, the control circuit 21 outputs the buzzer control signal P10, in response to which the buzzer driving circuit 37 drives the buzzer 42 to produce a prescribed buzzer sound (step ST41). The reason for producing the buzzer sound here is to notify the user that the time counting in the stopwatch mode is stopped in response to the depression of the start switch by the user. The control circuit 21 stops the driving of the buzzer 42 after a predetermined time. When driving the buzzer 42, if it is found from the detection conditions associated with the hand motor 34 driven in the immediately preceding period that the battery 5 is slow to recover, control may be performed to reduce the duty cycle of the buzzer 42 and thereby reduce the load.

As described above, even when there are a plurality of loads, such as the buzzer and the motor, that have entirely different characteristics and that are driven alternately, since the detection conditions including the recovery information of the battery 5 (such as the number of times of the measurement made or the time elapsed until the battery 5 recovers) obtained from the driving of the respective loads are stored in the storage circuit 22 for shared use, the drive instruction for driving any one of the loads and the detection conditions for the battery voltage Vbt after driving the load can be determined based on the stored detection conditions.

The drive instruction for driving the load and the detection conditions for the battery voltage Vbt after driving the load need not necessarily be determined based on the immediately preceding detection conditions stored in the storage circuit 22. For example, the detection conditions obtained over a long term period in relation to the driving of the load may be stored, and the drive instruction for driving the load and the detection conditions for the battery voltage Vbt after driving the load may be determined by referring to the thus stored long-term detection conditions. In that case, the driving conditions such as the driving speed of the load and the detection conditions for the battery voltage Vbt can be set meticulously by predicting changes in the state of charge, etc. from the changes in the recovery state of the battery 5 over the long term period.

Figure 13:
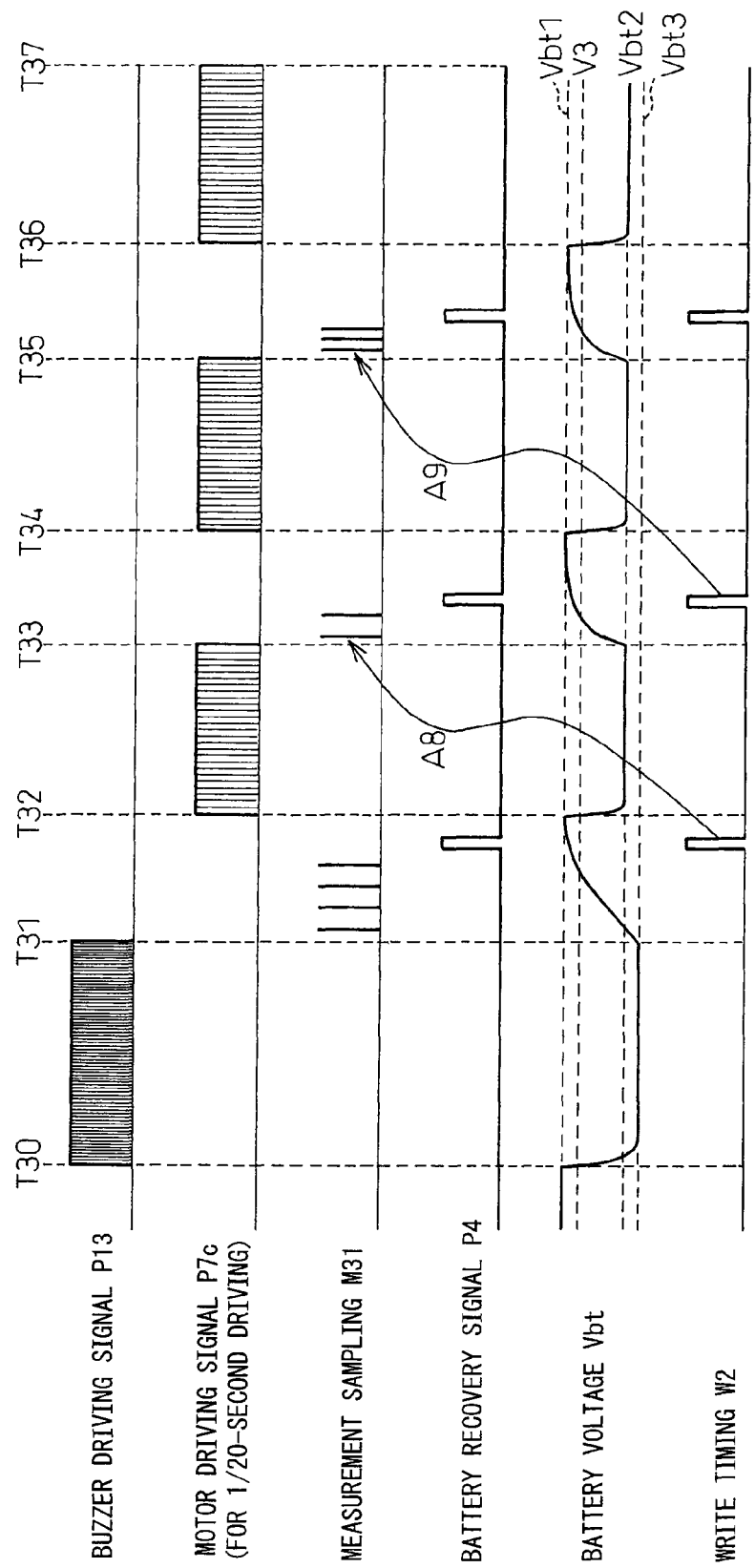
FIG. 13 is a timing chart explaining the driving operation when the plurality of loads to be driven in the multi-function electronic watch have different characteristics.
Figure 14:
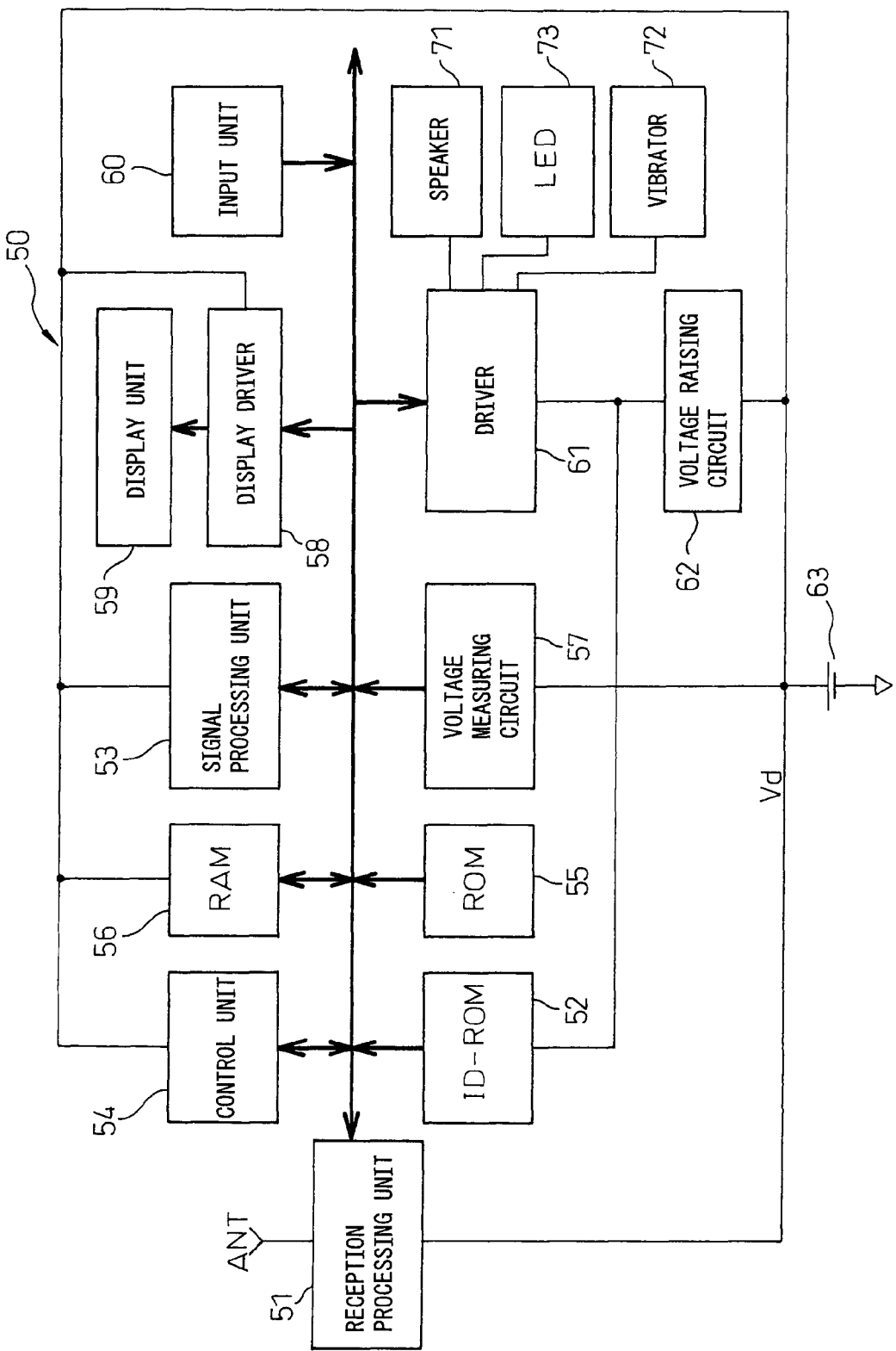
FIG. 14 is a block diagram schematically showing the configuration of a paging receiver equipped with a voltage judging means according to the prior art.

FIG. 13 is a timing chart for explaining the driving operation when the plurality of loads to be driven in the multi-function electronic watch have different characteristics.

Referring to the timing chart of FIG. 13, the operation will be described below by taking as an example the case where two different loads, the buzzer 42 and the 1/20-second stepping motor 36a, are driven in succession in the multi-function electronic watch 40.

In FIG. 13, the buzzer driving signal P13 is output for the duration of period from timing T30 to timing T31, and the buzzer 42 is driven to produce a buzzer sound. At this time, since a large drive current flows to the buzzer 42 due to the buzzer driving signal P13, the battery voltage Vbt of the battery 5 drops from the no-load voltage Vbt1 to the voltage Vbt3 in corresponding relationship to the output of the buzzer driving signal P13.

Next, when the driving of the buzzer 42 stops at timing T31, the control circuit 21 retrieves the past detection conditions from the storage circuit 22, and determines the detection conditions for the battery voltage Vbt. The battery information detection circuit 10 measures the battery voltage Vbt at predetermined intervals of time (measurement sampling M31). When the battery voltage Vbt becomes higher than the reference voltage V3, it is determined that the battery 5 has recovered, and the battery recovery signal P4 is output to the control circuit 21. In response to the battery recovery signal P4, the control circuit 21 stores the detection conditions newly obtained from the driving of the buzzer 42 into the storage circuit 22 by write timing W2.

When the battery recovery signal P4 is received, the control circuit 21 determines that the battery 5 has recovered sufficiently to be able to drive the next load, and outputs the motor driving signal P7c at timing T32 to perform the 1/20-second stepping operation.

The output of the motor driving signal P7c continues until timing T33, and the period from timing T32 to timing T33 defines one block of the 1/20-second stepping operation. At this time, since a medium amount of drive current flows to the 1/20-second stepping motor 36a due to the motor driving signal P7c, the battery voltage Vbt of the battery 5 drops from the no-load voltage Vbt1 to the voltage Vbt2 in corresponding relationship to the output of the motor driving signal P7c. Since the drive current of the buzzer 42 is larger than the drive current of the 1/20-second stepping motor 36a, the voltage Vbt3 when the buzzer 42 is driven is lower than the voltage Vbt2 when the 1/20-second stepping motor 36a is driven.

One block driving of the 1/20-second stepping operation of the 1/20-second stepping motor 36a ends at timing T33. After the driving of the 1/20-second stepping motor 36a ends, the control circuit 21 retrieves the past detection conditions from the storage circuit 22, and determines the detection conditions for the battery voltage Vbt. The battery information detection circuit 10 measures the battery voltage Vbt at predetermined intervals of time (measurement sampling M31). When the battery voltage Vbt becomes higher than the reference voltage V3, it is determined that the battery 5 has recovered, and the battery recovery signal P4 is output to the control circuit 21. In response to the battery recovery signal P4, the control circuit 21 stores the detection conditions newly obtained from the driving of the 1/20-second stepping motor 36a again into the storage circuit 22 by write timing W2.

The 1/20-second stepping operation of the 1/20-second stepping motor 36a is repeatedly performed on a block-by-block basis, as described above; accordingly, the 1/20-second stepping operation is started at timings T32, T34, T36, etc. and is stopped at timings T33, T35, T37, etc. as shown in the figure.

In the measurement sampling M31 after the end (timing T33) of the first 1/20-second stepping operation of the 1/20-second stepping motor 36a, the detection conditions for the battery voltage Vbt are determined based on the past detection conditions stored after the driving of the buzzer 42 performed in the immediately preceding period (as indicated by arrow A8). The buzzer 42 and the 1/20-second stepping motor 36a are loads having entirely different characteristics, and their drive currents are different in both magnitude and waveform. Accordingly, the past detection conditions stored in relation to the driving of the buzzer 42 do not perfectly match the driving of the 1/20-second stepping motor 36a.

However, since the detection information stored after the driving of the buzzer 42 represents the recovery information of the battery 5 immediately before driving the /20-second hand motor 36a, the information can provide sufficient information as to the state of charge of the battery 5, the ambient temperature, etc. when driving the 1/20-second stepping motor 36a. Therefore, the instruction for driving the 1/20-second stepping motor 36a and the detection conditions for the battery voltage Vbt after the driving can be determined using the detection conditions for the battery 5 obtained from the driving of the buzzer 42, and this has a great effect in achieving highly reliable load driving. Furthermore, since the battery state detection circuit 10 quickly detects the recovery of the battery 5 after driving the buzzer 42, the 1/20-second stepping operation can be quickly performed upon recovery of the battery 5 after driving the buzzer 42. This achieves smoother stopwatch operation with the buzzer sound immediately followed by the 1/20-second stepping operation.

On the other hand, in the measurement sampling M31 after the end (timing T35) of the second 1/20-second stepping operation of the 1/20-second stepping motor 36a, the detection conditions are determined based on the past detection conditions stored after the driving of the 1/20-second stepping motor 36a performed in the immediately preceding period (as indicated by arrow A9). In other words, for the second and subsequent 1/20-second stepping operations of the 1/20-second stepping motor 36a, the drive instruction and the detection conditions for the battery voltage Vbt are determined based on the immediately preceding 1/20-second stepping operation of the 1/20-second stepping motor 36a. Since the detection conditions can be dynamically varied based on the past detection conditions obtained for the same load under the same driving conditions and representing the state of charge of the battery 5 in the immediately preceding period, optimum load driving and battery state detection can be achieved. The new detection conditions may be determined by also using other information such as the ambient temperature.

In the measurement sampling M31 after timing T35 in FIG. 13, for example, the measurement of the battery voltage Vbt is started by setting the measurement time intervals shorter than those employed in the measurement sampling after timing T33. This is because the control circuit 21 has changed the detection conditions (measurement time intervals) at timing T35 by determining that the battery 5 recovers quickly, based on the detection information stored after the immediately preceding driving.

As described above, in the electronic apparatus according to the present invention, when there are a plurality of loads, such as the buzzer and the motor, that have entirely different characteristics and that are driven alternately, the detection conditions obtained from the driving of the respective loads can be stored in the storage means for shared use. As a result, using the detection conditions stored for shared use, the drive instruction for driving any load having a different characteristic and the detection conditions for the battery voltage after driving such a load can be determined. Accordingly, in an electronic apparatus that implements its functions by driving in a complex manner a plurality of loads having different characteristics, it becomes possible to drive the plurality of loads quickly in a highly reliable manner.

The loads having different characteristics are not limited to the motor and the buzzer, but they may be the LED 43 and the sensor 44 mounted in the multi-function electronic watch 40 of the second embodiment. The electronic apparatus according to the present invention can be applied to a variety of electronic apparatuses, including mobile phones and digital cameras, that are equipped with various kinds of loads such as a vibrator, an LCD or other display device, a communication device, an imaging device, etc. though not shown here.

Further, in the electronic apparatus according to the present invention, the conditions for detecting the battery recovery after driving the load can be varied as desired by changing the setting of the timer 11 in the battery recovery detection circuit 10 or the setting of the reference voltage generating circuit 13 constructed from a D/A conversion circuit. As a result, if the kind of the battery or the characteristic of the load changes as a result of changing the specification of the electronic apparatus, the detection conditions can be easily corrected by making necessary corrections to the firmware contained in the control means. Accordingly, the electronic apparatus according to the present invention can flexibly accommodate any change in the specification or design.

What is claimed is:

1. An electronic apparatus comprising:
a power supply having a battery;
a load;
a load driver that drives said load by said battery;
a power supply state detector that outputs power supply recovery information, wherein said power supply recovery information is obtained by repeatedly sampling a measured voltage value of said battery at predetermined intervals of time beginning at a start time, measured after a time said driving of said load is stopped, said sampling being performed under the condition that said battery has not recovered after the driving of said load is stopped; and
a controller that instructs said load driver to drive said load, based on said power supply recovery information supplied from said power supply state detector,
wherein said controller controls said power supply state detector so as to select said predetermined intervals of time, each of which is different in duration, or selects a starting time for sampling the measured voltage of said battery from a plurality of starting times after said driving of said load is stopped.

2. The electronic apparatus according to claim 1, wherein said controller controls said power supply state detector to select said predetermined interval of time or selects said starting time on the basis of a recovery condition of said power supply, which is obtained under the condition that the driving of said load is stopped.

3. The electronic apparatus according to claim 2, further comprising a memory for storing the recovery condition under the condition that the driving of said load is stopped at a past time or the start timing for sampling which is obtained under the condition that the driving of said load is stopped, and
wherein said controller selects said predetermined interval of time or said starting time on the basis of said stored recovery condition.

4. The electronic apparatus according to claim 3, wherein when said power supply state detector does not output said power supply recovery information even though the sampling of the measured voltage of said battery has been performed a predetermined number of times, or when it is determined that said battery has not recovered sufficiently to be able to drive said load even though a predetermined time has elapsed from the start of the sampling of the measured voltage of said battery, said controller causes said electronic apparatus to enter a power recovery mode in which priority is given to making said battery recover.

5. The electronic apparatus according to claim 4,
wherein said memory further stores past detection conditions including said predetermined intervals of time, said reference value, said predetermined number of sampling, or said predetermined elapsed time, and
wherein said controller varies, based on said previous sampling conditions stored in said memory, one or more of said predetermined intervals of time, said reference value, and said predetermined number of samplings.

6. The electronic apparatus according to claim 3, wherein:
said load is a first load and said electronic apparatus has a second load different from said first load,
said power supply state detector outputs said power supply recovery information intended for said first load and said second load,
said controller instructs said load driver to drive said second load, based on said power supply recovery information obtained by driving said first load,
said controller controls said power supply state detector so as to select said predetermined interval of time from a plurality of intervals of time, each of which is different in duration, or selects a starting time for repeatedly sampling the measured voltage value of said battery from a plurality of starting times, on the basis of the power supply recovery information, which is obtained by the driving of said first load when the sampling of the measured voltage value of said battery is performed after the driving of said second load is stopped.

7. The electronic apparatus according to claim 1, wherein said recovery condition is recovery time.

8. The electronic apparatus according to claim 1, wherein said controller selects said predetermined interval of time or said starting time on the basis of a driving condition of said load, which is obtained under the condition that the driving of said load is stopped.

9. The electronic apparatus according to claim 8, wherein said driving condition comprises forward direction driving and backward direction driving.

10. The electronic apparatus according to claim 1, wherein said controller selects said predetermined interval of time or said starting time on the basis of a battery charging condition, an ambient temperature, or a battery capacity.

11. The electronic apparatus according to claim 1, wherein said controller varies the frequency for performing said power supply state detection on the basis of the recovery state of said power supply, which is obtained under the condition that the driving of said load is stopped.

12. The electronic apparatus according to claim 1, wherein said power supply state detector compares the voltage of said battery with a reference value at said predetermined interval of time and, when the voltage of said battery exceeds said reference value, outputs said power supply recovery information comprising a determination that said battery has recovered sufficiently to be able to drive said load, whereupon said load driver resumes the driving of said load in accordance with a drive instruction supplied from said controller.

13. The electronic apparatus according to claim 1, wherein said predetermined interval of time is shorter than a recovery time that said battery requires to recover sufficiently to be able to drive said load.

14. The electronic apparatus according to claim 1, wherein said load is one of a motor, a vibrator, an audio device, an illumination device, a display device, a communication device, an imaging device, or a sensor.

* * * * *